United States Patent
Yokoyama et al.

(10) Patent No.: US 8,765,507 B2
(45) Date of Patent: Jul. 1, 2014

(54) METHOD FOR MANUFACTURING GROUP III NITRIDE SEMICONDUCTOR, METHOD FOR MANUFACTURING GROUP III NITRIDE SEMICONDUCTOR LIGHT-EMITTING DEVICE, GROUP III NITRIDE SEMICONDUCTOR LIGHT-EMITTING DEVICE, AND LAMP

(75) Inventors: Yasunori Yokoyama, Ichihara (JP); Hisayuki Miki, Chiba (JP)

(73) Assignee: Toyoda Gosei Co., Ltd., Aichi (JP)

( * ) Notice: Subject to any disclaimer, the term of this patent is extended or adjusted under 35 U.S.C. 154(b) by 143 days.

(21) Appl. No.: 12/745,304

(22) PCT Filed: Nov. 21, 2008

(86) PCT No.: PCT/JP2008/071228
§ 371 (c)(1),
(2), (4) Date: Jul. 2, 2010

(87) PCT Pub. No.: WO2009/069550
PCT Pub. Date: Jun. 4, 2009

(65) Prior Publication Data
US 2010/0301379 A1    Dec. 2, 2010

(30) Foreign Application Priority Data
Nov. 29, 2007    (JP) ................... 2007-308823

(51) Int. Cl.
*H01L 33/04*    (2010.01)
(52) U.S. Cl.
USPC ............ 438/45; 438/46; 438/761; 438/478; 438/507; 438/509; 427/551; 427/595; 427/597

(58) Field of Classification Search
USPC ............ 427/551, 595, 597; 438/45, 46, 761, 438/478, 507, 509
See application file for complete search history.

(56) References Cited

U.S. PATENT DOCUMENTS

| 4,874,438 A * | 10/1989 | Oshita et al. ................. 148/400 |
| 6,692,568 B2 * | 2/2004 | Cuomo et al. ................. 117/84 |

(Continued)

FOREIGN PATENT DOCUMENTS

| CN | 1425189 A | 6/2003 |
| JP | 60-39819 A | 3/1985 |

(Continued)

OTHER PUBLICATIONS

Chinese Office Action dated Aug. 31, 2011 for corresponding Chinese Patent Application No. 200880125692.5.

(Continued)

*Primary Examiner* — Michael Shingleton
(74) *Attorney, Agent, or Firm* — Sughrue Mion, PLLC

(57) ABSTRACT

A method for manufacturing a Group III nitride semiconductor of the present invention includes a sputtering step of forming a single-crystalline Group III nitride semiconductor on a substrate by a reactive sputtering method in a chamber in which a substrate and a Ga element-containing target are disposed, wherein said sputtering step includes respective substeps of: a first sputtering step of performing a film formation of the Group III nitride semiconductor while setting the temperature of the substrate to a temperature $T1$; and a second sputtering step of continuing the film formation of the Group III nitride semiconductor while lowering the temperature of the substrate to a temperature $T2$ which is lower than the temperature $T1$.

13 Claims, 5 Drawing Sheets

(56) References Cited

U.S. PATENT DOCUMENTS

| | | | |
|---|---|---|---|
| 2002/0078881 A1 | 6/2002 | Cuomo et al. | |
| 2003/0109076 A1 | 6/2003 | Senda et al. | |
| 2003/0134447 A1 | 7/2003 | Shibata et al. | |
| 2006/0146598 A1* | 7/2006 | Miltat et al. | 365/158 |
| 2006/0240584 A1 | 10/2006 | Fudeta et al. | |
| 2007/0120141 A1* | 5/2007 | Moustakas et al. | 257/103 |
| 2007/0141823 A1* | 6/2007 | Preble et al. | 438/604 |
| 2008/0116478 A1* | 5/2008 | Miki et al. | 257/103 |
| 2008/0121924 A1* | 5/2008 | Miki et al. | 257/103 |
| 2008/0223434 A1* | 9/2008 | Ikenoue et al. | 136/252 |
| 2008/0242060 A1* | 10/2008 | Kosaka et al. | 438/478 |
| 2009/0053453 A1* | 2/2009 | Basu et al. | 428/64.1 |
| 2009/0114942 A1* | 5/2009 | Yokoyama et al. | 257/103 |
| 2009/0142870 A1* | 6/2009 | Miki et al. | 438/46 |
| 2009/0146161 A1* | 6/2009 | Miki et al. | 257/94 |
| 2009/0194784 A1* | 8/2009 | Kaji et al. | 257/103 |
| 2009/0205707 A1* | 8/2009 | Ikenoue et al. | 136/255 |
| 2009/0206361 A1* | 8/2009 | Miki et al. | 257/103 |
| 2009/0283795 A1* | 11/2009 | Miki et al. | 257/103 |
| 2009/0289270 A1* | 11/2009 | Hanawa et al. | 257/98 |
| 2009/0289330 A1* | 11/2009 | Shibata | 257/615 |
| 2009/0315046 A1* | 12/2009 | Miki et al. | 257/94 |
| 2010/0006430 A1* | 1/2010 | Miki et al. | 204/298.13 |
| 2010/0044718 A1* | 2/2010 | Hanser et al. | 257/76 |
| 2010/0051980 A1* | 3/2010 | Miki et al. | 257/94 |
| 2010/0065855 A1* | 3/2010 | Yokoyama et al. | 257/76 |
| 2010/0102360 A1* | 4/2010 | Nakada et al. | 257/201 |
| 2010/0163931 A1* | 7/2010 | Fujioka et al. | 257/200 |
| 2010/0213476 A1* | 8/2010 | Yokoyama et al. | 257/94 |
| 2010/0219445 A1* | 9/2010 | Yokoyama et al. | 257/101 |
| 2010/0244040 A1* | 9/2010 | Yokoyama et al. | 257/76 |
| 2010/0244086 A1* | 9/2010 | Hanawa et al. | 257/103 |
| 2011/0062479 A1* | 3/2011 | Sugano et al. | 257/98 |
| 2011/0068349 A1* | 3/2011 | Shinohara et al. | 257/76 |
| 2011/0079507 A1* | 4/2011 | Kaji | 204/192.1 |
| 2011/0089401 A1* | 4/2011 | Hiraiwa et al. | 257/13 |
| 2011/0095327 A1* | 4/2011 | Shinohara et al. | 257/98 |
| 2011/0095331 A1* | 4/2011 | Hanawa et al. | 257/99 |
| 2011/0101391 A1* | 5/2011 | Miki et al. | 257/94 |
| 2011/0147763 A1* | 6/2011 | Hanawa et al. | 257/76 |
| 2011/0163349 A1* | 7/2011 | Sakai et al. | 257/99 |
| 2011/0163350 A1* | 7/2011 | Yokoyama et al. | 257/100 |
| 2011/0207299 A1* | 8/2011 | Sakurai | 438/478 |
| 2011/0284919 A1* | 11/2011 | Yokoyama et al. | 257/103 |
| 2012/0086027 A1* | 4/2012 | Yokoyama et al. | 257/94 |
| 2012/0104556 A1* | 5/2012 | Kiyama et al. | 257/615 |

FOREIGN PATENT DOCUMENTS

| | | |
|---|---|---|
| JP | 63-035492 A | 2/1988 |
| JP | 64-039018 A | 2/1989 |
| JP | 01-246817 A | 10/1989 |
| JP | 4-297023 A | 10/1992 |
| JP | 5-86646 B2 | 12/1993 |
| JP | 3026087 B2 | 1/2000 |
| JP | 2002-43617 A | 2/2002 |
| JP | 2003-077835 A | 3/2003 |
| JP | 2004-142953 A | 5/2004 |
| JP | 2004-523450 A | 8/2004 |
| JP | 2004-288757 A | 10/2004 |
| JP | 2005-145753 A | 6/2005 |
| JP | 2006-324622 A | 11/2006 |
| JP | 2007-42944 A | 2/2007 |
| JP | 2007-103955 A | 4/2007 |
| KR | 1020030059299 A | 7/2003 |
| WO | 02/44443 A1 | 6/2002 |
| WO | WO 0244444 A1 | 6/2002 |
| WO | 2008136504 A1 | 11/2008 |

OTHER PUBLICATIONS

Korean Office Action (Notice of Allowance) dated Aug. 25, 2011 for corresponding Korean Patent Application No. 10-2010-7013669.

Japanese Office Action (Notice of Reasons for Rejection) dated Dec. 11, 2012 for corresponding Japanese Patent Application No. 2007-308823.

Notice of Allowance with a mailing date of Apr. 16, 2013 for corresponding Japanese Patent Application No. 2007-308823.

* cited by examiner

METHOD FOR MANUFACTURING GROUP III NITRIDE SEMICONDUCTOR, METHOD FOR MANUFACTURING GROUP III NITRIDE SEMICONDUCTOR LIGHT-EMITTING DEVICE, GROUP III NITRIDE SEMICONDUCTOR LIGHT-EMITTING DEVICE, AND LAMP

TECHNICAL FIELD

The present invention relates to a method for manufacturing a Group III nitride semiconductor which is suitably used for a light emitting diode (LED), a laser diode (LD), an electronic device, and the like, and represented by the general formula $Al_aGa_bIn_cN$ ($0 \leq a \leq 1$, $0 \leq b \leq 1$, $0 \leq c \leq 1$, and $a+b+c=1$); a method for manufacturing a Group III nitride semiconductor light-emitting device; a Group III nitride semiconductor light-emitting device; and a lamp.

Priority is claimed on Japanese Patent Application No. 2007-308823, filed Nov. 29, 2007, the content of which is incorporated herein by reference.

BACKGROUND ART

Group III nitride semiconductors offer a direct transition over a band gap energy from visible light to ultraviolet rays, and excel in the light emission efficiency, and thus have been manufactured as semiconductor light-emitting devices such as a light emitting diode (LED) and a laser diode (LD) for use in various applications. In addition, when used for an electronic device, Group III nitride semiconductors have a potential to provide electronic devices having characteristics superior to those using conventional Group III-V compound semiconductors.

Such Group III nitride compound semiconductors are, in general, produced from trimethyl gallium, trimethyl aluminum, and ammonia as raw materials through a Metal Organic Chemical Vapor Deposition (MOCVD) method. The MOCVD method is a method in which a vapor of a raw material is introduced into a carrier gas to convey the vapor to the surface of a substrate and decompose the raw material due to the reaction with the surface of the heated substrate, to thereby grow a crystal. Meanwhile, hitherto, a single crystal wafer of a Group III nitride semiconductor has not been commercially available, and Group III nitride semiconductors are, in general, produced by growing a crystal on a single crystal wafer of a different material.

As the above method for growing a Group III nitride semiconductor, there has been proposed and generally performed a method for epitaxially growing a Group III nitride semiconductor crystal on a single crystal sapphire substrate or a single crystal SiC substrate through a Metal Organic Chemical Vapor Deposition (MOCVD) method, in which, firstly, a layer called a low temperature buffer layer made of aluminum nitride (AlN) or aluminum nitride gallium (AlGaN) is laminated on a substrate, and then a Group III nitride semiconductor crystal is epitaxially grown thereon at a high temperature (for example, Patent Documents 1 and 2).

In addition, there has been proposed the technique for forming the buffer layer through a method other than the MOCVD method. For example, a method has been proposed in which a buffer layer is formed by high frequency sputtering, and a crystal having the same composition is grown thereon by the MOCVD method (for example, Patent Document 3).

In addition, research has been conducted on the manufacture of a Group III nitride semiconductor crystal by a sputtering method. For example, with a purpose of laminating high resistance GaN, a method for forming a GaN film directly on a substrate made of sapphire by a sputtering method has been proposed (for example, Patent Document 4). The film formation of GaN using a sputtering method has advantages in that facilities are inexpensive in comparison with the film formation using a MOCVD method as described in the above Patent Documents 1-3 and that the production yield is improved due to the stabilization of each step.

When a crystal of a Group III nitride semiconductor is subjected to the film formation using a sputtering method, a substrate temperature during the film formation is important parameter. As a result of intensive studies conducted by the inventors of the present invention, a film of GaN having excellent crystallinity is formed by setting a substrate temperature to a relatively high temperature when GaN is subjected to the film formation using a conventional sputtering method as described in the above Patent Document 4. However, the surface of a film gets rough, and the film formation rate extremely decreases, to thereby lowering the production yield. Meanwhile, when the film formation is performed while setting a substrate temperature to a relatively low temperature, the film formation rate is improved. However, the crystallinity of the formed film of GaN deteriorates. In particular, it was found that the full width at half maximum in the X-ray rocking curve of the asymmetric plane increased.

Therefore, a method has been desired which is capable of stably forming a film having excellent crystallinity on a substrate with high efficiency when a Group III nitride semiconductor is formed by using a sputtering method.

Patent Document 1: Japanese Patent No. 3026087
Patent Document 2: Japanese Unexamined Patent Application, First Publication No. Hei 4-297023
Patent Document 3: Japanese Examined Patent Application, Second Publication No. Hei 5-86646
Patent Document 4: Japanese Unexamined Patent Application, First Publication No. Sho 60-039819

DISCLOSURE OF INVENTION

Problems to be Solved by the Invention

The present invention takes the above problems into consideration with an object of providing a method for manufacturing a Group III nitride semiconductor, which can efficiently form a Group III nitride semiconductor crystal with good crystallinity at a high film formation rate using a sputtering method. In addition, the present invention has another object to provide a method for manufacturing a Group III nitride semiconductor light-emitting device using the method for manufacturing a Group III nitride semiconductor. In addition, the present invention has other objects to provide a Group III nitride semiconductor light-emitting device with excellent light emission characteristics using the above manufacturing method, and a lamp.

Means to Solve the Problems

As a result of intensive studies conducted by the inventors of the present invention in order to solve the above problems, the following knowledge was found regarding the formation of a Group III nitride semiconductor using a sputtering method. Firstly, when the film formation is performed while setting a substrate temperature to a high temperature, the loop of initial dislocation is enhanced by migration, and the dislocation density is reduced. Then, when the film formation rate is increased by setting a substrate temperature to a low temperature, a film of a Group III nitride semiconductor having excellent crystallinity and a desired thickness can be formed in a short time. The present invention was completed on the basis of these findings.

That is, the present invention relates to the following.

[1] A method for manufacturing a Group III nitride semiconductor, comprising:

a sputtering step of forming a single-crystalline Group III nitride semiconductor on a substrate by a reactive sputtering method in a chamber in which a substrate and a Ga element-containing target are disposed, wherein said sputtering step includes respective substeps of: a first sputtering step of performing a film formation of the Group III nitride semiconductor while setting the temperature of the substrate to a temperature T1; and a second sputtering step of continuing the film formation of the Group III nitride semiconductor while lowering the temperature of the substrate to a temperature T2 which is lower than the temperature T1.

[2] The method for manufacturing a Group III nitride semiconductor according to [1], wherein the temperature T1 of the substrate is within a range of 800° C. to 1,100° C. in said first sputtering step, and the temperature T2 of the substrate is within a range of 700° C. to 1,000° C. in said second sputtering step.

[3] The method for manufacturing a Group III nitride semiconductor according to [1] or [2], wherein the temperatures T1 and T2 of the substrate satisfy a relationship represented by a following formula: $\{20° C. \leq (T1-T2) \leq 300° C.\}$.

[4] The method for manufacturing a Group III nitride semiconductor according to [1] or [2], wherein the temperatures T1 and T2 of the substrate satisfy a relationship represented by a following formula: $\{50° C. \leq (T1-T2) \leq 200° C.\}$.

[5] The method for manufacturing a Group III nitride semiconductor according to any one of [1] to [4], wherein a film of the Group III nitride semiconductor with a thickness t1 within a range of 5 to 100 nm is formed in said first sputtering step, and then a film of the Group III nitride semiconductor with a thickness t2 of 10 nm or more is formed in said second sputtering step.

[6] The method for manufacturing a Group III nitride semiconductor according to any one of [1] to [5], wherein the Group III nitride semiconductor is subjected to the film formation in a gas atmosphere having a nitrogen atom-containing gas and an inert gas in said first sputtering step and second sputtering step.

[7] The method for manufacturing a Group III nitride semiconductor according to [6], wherein the nitrogen atom-containing gas is a nitrogen gas ($N_2$), and the inert gas is an argon gas (Ar).

[8] The method for manufacturing a Group III nitride semiconductor according to any one of [1] to [7], further comprising:

a vacuum step of preparing a vacuum state in the chamber and heating the substrate to the temperature T1, wherein said first sputtering step and second sputtering step are performed in this order following said vacuum step.

[9] The method for manufacturing a Group III nitride semiconductor according to any one of [1] to [7], further comprising:

a buffer layer formation step of forming a buffer layer on the substrate by the reactive sputtering method, wherein said vacuum step, first sputtering step, and second sputtering step are performed in this order following said buffer layer formation step.

[10] The method for manufacturing a Group III nitride semiconductor according to [9], further comprising:

a pretreatment step of subjecting a surface of the substrate to a pretreatment by a plasma treatment, wherein said buffer layer formation step, vacuum step, first sputtering step, and second sputtering step are performed in this order following said pretreatment step.

[11] A method for manufacturing a Group III nitride semiconductor light-emitting device, comprising laminating an n-type semiconductor layer, a light-emitting layer, and a p-type semiconductor layer in this order, each layer being comprised of a Group III nitride semiconductor wherein at least a part of the n-type semiconductor layer is formed by the method for manufacturing a Group III nitride semiconductor according to any one of [1] to [10].

[12] The method for manufacturing a Group III nitride semiconductor light-emitting device according to [11], wherein the n-type semiconductor layer comprises a ground layer, and the ground layer is formed by the method for manufacturing a Group III nitride semiconductor according to any one of [1] to [10].

[13] A Group III nitride semiconductor light-emitting device which is obtained by the method for manufacturing a Group III nitride semiconductor light-emitting device according to [11] or [12].

[14] A lamp comprising the Group III nitride semiconductor light-emitting device according to [13].

Effect of the Invention

According to the method for manufacturing a Group III nitride semiconductor of the present invention, firstly, a substrate temperature is set to a high temperature, to thereby generate migration. Thus, the loop of initial dislocation is enhanced, and the dislocation density of a crystal is reduced. The film formation is performed in this condition, and thereafter, the film formation rate of a crystal is increased by setting a substrate temperature to a low temperature. Thus, a film having a desired thickness can be formed in a short time. Consequently, a crystal of a Group III nitride semiconductor having excellent crystallinity can be efficiently formed at a high film formation rate.

Furthermore, according to the method for manufacturing a Group III nitride semiconductor light-emitting device of the present invention, the method is to form at least a part of the n-type semiconductor layer from a single-crystalline Group III nitride semiconductor by the above manufacturing method. Therefore, a Group III nitride semiconductor light-emitting device which comprises the n-type semiconductor layer comprised of a Group III nitride semiconductor having excellent crystallinity, and has excellent light emission characteristics, can be obtained.

DESCRIPTION OF THE REFERENCE SYMBOLS

1: Group III nitride semiconductor light-emitting device (light-emitting device), 10: Laminated semiconductor (Group III nitride semiconductor), 11: Substrate, 11a: Surface, 12: Buffer layer, 14: N-type semiconductor layer, 14a: Ground layer (Group III nitride semiconductor), 15: Light-emitting layer, 16: P-type semiconductor layer, 16a: P-type clad layer, 16b: P-type contact layer, 3: Lamp, 40: Sputtering apparatus, 41: Chamber, 47: Target, T1 and T2: Temperature (Substrate), t1 and t2: Film thickness (Group III nitride semiconductor)

BEST MODE FOR CARRYING OUT THE INVENTION

Hereunder is a description of one embodiment of a method for manufacturing a Group III nitride semiconductor, a method for manufacturing a Group III nitride semiconductor light-emitting device, a Group III nitride semiconductor light-emitting device, and a lamp according to the present invention, with appropriate reference to FIGS. 1 to 7.
[Method for Manufacturing a Group III Nitride Semiconductor]

The method for manufacturing a Group III nitride semiconductor according to the present embodiment comprises a sputtering step of forming at least a single-crystalline Group III nitride semiconductor doped with a donor impurity on a substrate 11 by a reactive sputtering method in a chamber 41 (refer to FIG. 5) in which a substrate 11 (refer to FIGS. 1 to 3 and 5) and a Ga element-containing target 47 (refer to FIG. 5) are disposed, wherein said sputtering step includes respective substeps of: a first sputtering step of performing a film formation of the Group III nitride semiconductor while setting the temperature of the substrate 11 to a temperature T1 (refer to graphs of FIGS. 6 and 7); and a second sputtering step of continuing the film formation of the Group III nitride semiconductor while lowering the temperature of the substrate 11 to a temperature T2 which is lower than the temperature T1 (refer to graphs of FIGS. 6 and 7).
<Laminated Structure of Semiconductor>

Figure 1:
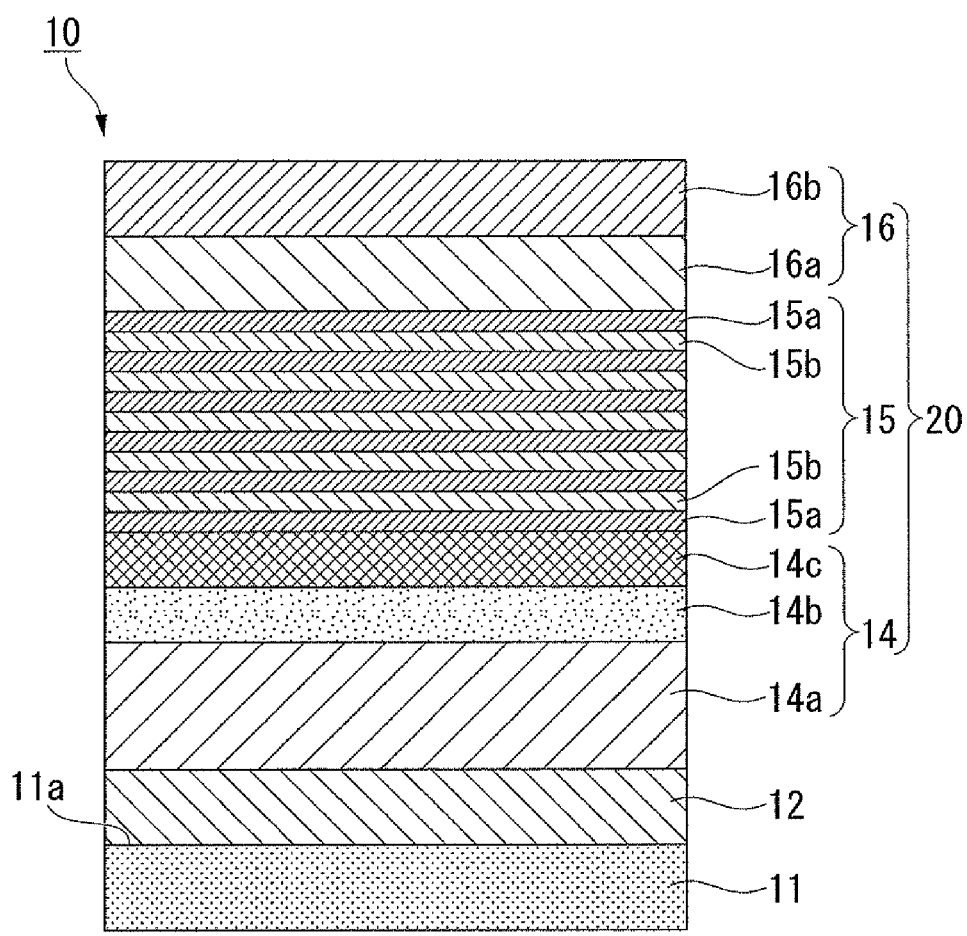
FIG. 1 is a schematic diagram for explaining an example of a Group III nitride semiconductor according to the present invention, showing a cross-sectional structure of a laminated semiconductor.

FIG. 1 is a schematic diagram for explaining an example of the method for manufacturing a Group III nitride semiconductor according to the present embodiment, being a schematic cross-sectional diagram showing an example of a laminated semiconductor in which the Group III nitride semiconductor is formed on a substrate 11. In the laminated semiconductor 10 as shown in FIG. 1, on the substrate 11 is laminated a buffer layer 12 made of a Group III nitride compound; and on the buffer layer 12 is formed a semiconductor layer 20 having an n-type semiconductor layer 14, a light-emitting layer 15, and a p-type semiconductor layer 16 sequentially laminated.

The n-type semiconductor layer 14 of the present embodiment is made of a single-crystalline Group III nitride semiconductor doped with a donor impurity, and is formed by the manufacturing method, details of which will be described later.

Hereunder is a detailed description of the laminated structure of the Group III nitride semiconductor of the present embodiment.
[Substrate]

In the present embodiment, sapphire is used as an example of a material of the substrate 11.

As a material which can be used for the substrate 11 in present embodiment, any substrate material on the surface of which a Group III nitride compound semiconductor crystal can epitaxially grow, can be used by selecting from various materials without particular limitations. Examples thereof include sapphire, SiC, silicon, zinc oxide, magnesium oxide, manganese oxide, zirconium oxide, manganese oxide zinc iron, magnesium oxide aluminum, zirconium borate, gallium oxide, indium oxide, lithium oxide gallium, lithium oxide aluminum, neodymium oxide gallium, lantern oxide strontium aluminum tantalum, strontium oxide titanium, titanium oxide, hafnium, tungsten, and molybdenum. Among them, a material having a hexagonal crystal structure such as sapphire and SiC is preferably used for the substrate, since a Group III nitride semiconductor having excellent crystallinity can be laminated thereon. Sapphire is more preferably used.

In addition, regarding the size of the substrate, those having a diameter of about two inches are usually used, while those having a diameter of four to six inches can also be used for the Group III nitride semiconductor of the present invention.

Among the abovementioned substrate materials, some oxide substrates and metal substrates are known to cause chemical decomposition by being contacted with ammonia at a high temperature. If such an oxide substrate or a metal substrate is used, it is effective to form a buffer layer without using ammonia and to form a ground layer which constitutes an n-type semiconductor layer, which will be described later, with ammonia, in terms of prevention of such chemical decomposition of the substrate because the buffer layer of the present embodiment acts as a coat layer. In addition, in general, the temperature of the substrate can be kept low in a sputtering method. Hence, even if a substrate made of a material decomposable at high temperatures is used, each layer can be formed on the substrate without damaging the substrate 11.
[Buffer Layer]

In the laminated semiconductor 10 of the present embodiment, the buffer layer 12 made of a Group III nitride compound is formed on the substrate 11 through a reaction between a metal material and a group V element-containing gas under plasma activation using a reactive sputtering method. A film formed by a method using plasma of a metal material as shown in the present embodiment has an effect of readily attaining orientation.

The crystal of the Group III nitride compound forming such a buffer layer has a crystal structure of hexagonal system, and can be formed into a single crystal film by controlling film formation conditions. Moreover, the crystal of the Group III nitride compound can also be in a form of a columnar crystal made of an aggregate structure that is basically a hexagonal column, by controlling the above film formation conditions. The columnar crystal described herein refers to a crystal in which adjacent crystal grains are separated since grain boundaries are formed therebetween, and the crystal itself is in a columnar shape in a longitudinal section.

The buffer layer 12 preferably takes a single crystal structure, in terms of the buffer function. As described above, the crystal of the Group III nitride compound has a crystal structure of a hexagonal system, and forms a structure that is basically a hexagonal column. The crystal of the Group III nitride compound is capable of forming a crystal film grown in the in-plane direction, by controlling film formation conditions or the like. When the buffer layer 12 having such a single crystal structure is formed on the substrate 11, the buffer function of the buffer layer 12 effectively works. Therefore, the layer of the Group III nitride semiconductor to be formed thereon will become a crystal film having excellent orientation and crystallinity.

The thickness of the buffer layer 12 is preferably within a range of 20 to 80 nm. By setting the thickness of the buffer layer 12 within this range, the buffer layer 12 can attain excellent orientation and effectively function as a coat layer upon formation of respective layers made of Group III nitride semiconductors on the buffer layer 12.

If the thickness of the buffer layer 12 is less than 20 nm, the above-mentioned function as a coat layer may become insufficient. In addition, if the buffer layer 12 is formed with a thickness of more than 80 nm, it may take a longer time to form the layer although the function as a coat layer remains unchanged, which may lower the productivity.

It is preferable that Al be included in the composition of the buffer layer 12. Any Group III nitride compound semiconductor material represented by the general formula AlGaInN may be used as the materials that constitute the buffer layer 12. Furthermore, As or P may also be contained as a group V element. Moreover when the buffer layer 12 has an Al-containing composition, then in particular, the composition is preferably GaAlN. In such a case, the composition preferably contains Al at 50% or more. In addition, more preferably, the buffer layer 12 is made of AlN.

Furthermore, as the material for forming the buffer layer 12, any material having the same crystal structure as that of the Group III nitride semiconductor may be used, although materials having a lattice length close to that of a Group III nitride semiconductor for forming the ground layer, which will be described later, are preferred, and in particular nitrides of Group IIIa elements in the periodic table are suitable.

[Semiconductor Layer]

As shown in FIG. 1, in the laminated semiconductor 10 of the present embodiment, a semiconductor layer 20, which is composed of a Group III nitride-based semiconductor and comprises the n-type semiconductor layer 14, the light-emitting layer 15, and the p-type semiconductor layer 16, is laminated on the substrate 11 through a buffer layer 12. In addition, in the laminated semiconductor 10 exemplified in the drawing, a ground layer 14a provided in the n-type semiconductor layer 14 is laminated on the buffer layer 12.

As the Group III nitride semiconductor, a variety of gallium nitride-based compound semiconductors such as those represented by the general formula $Al_XGa_YIn_ZN_{1-A}M_A$ ($0 \leq X \leq 1$, $0 \leq Y \leq 1$, $0 \leq Z \leq 1$, and $X+Y+Z=1$. The symbol M represents a Group V element other than nitrogen (N), and $0 \leq A < 1$) are known. In the present invention, any gallium nitride-based compound semiconductor represented by the general formula $Al_XGa_YIn_ZN_{1-A}M_A$ ($0 \leq X \leq 1$, $0 \leq Y \leq 1$, $0 \leq Z \leq 1$, and $X+Y+Z=1$. The symbol M represents a Group V element other than nitrogen (N), and $0 \leq A < 1$), including these known gallium nitride-based compound semiconductors, may be employed without any limitations.

The gallium nitride-based compound semiconductor may contain any other Group III element other than Al, Ga, and In, and may also contain, if necessary, an element such as Ge, Si, Mg, Ca, Zn, Be, P, and As. Furthermore, in some cases, such a gallium nitride-based compound semiconductor contains not only intentionally added elements, but also impurities inevitably contained depending on the film formation conditions, and the like, and trace amounts of impurities contained in raw materials and reaction tube materials.

[N-type Semiconductor Layer]

The n-type semiconductor layer 14 is usually laminated on the buffer layer 12, and made of the ground layer 14a, an n-type contact layer 14b, and an n-type clad layer 14c. It should be noted that the n-type contact layer may function as a ground layer and/or an n-type clad layer, whereas the ground layer may also function as an n-type contact layer and/or an n-type clad layer.

[Ground Layer]

The ground layer 14a of the present embodiment is made of a Group III nitride semiconductor, and is formed by laminating on the buffer layer 12 by a reactive sputtering method in the method for manufacturing a Group III nitride semiconductor of the present embodiment, details of which will be described later.

It is not always necessary for the material of the ground layer 14a to be the same as that of the buffer layer 12 formed on the substrate 11, and different materials may be used; however, the ground layer 14a is preferably composed of an $Al_yGa_{1-y}N$ layer ($0 \leq y \leq 1$, preferably $0 \leq y \leq 0.5$, and more preferably $0 \leq y \leq 0.1$).

In the present invention, a ground layer 14a composed of a single crystal Group III nitride semiconductor is previously formed on the buffer layer 12. A single-crystalline layer of a Group III nitride semiconductor having excellent crystallinity can be readily formed on the single crystal ground layer 14a by a sputtering method. Therefore, a Group III nitride semiconductor whose conductivity has been controlled by adding an dopant can be readily obtained.

As the material used for the ground layer 14a, a Ga-containing Group III nitride compound, i.e. a GaN-based compound semiconductor, is used. In particular, AlGaN or GaN can be suitably used.

In addition, if the buffer layer 12 is formed into a columnar crystal aggregate made of AlN, it is necessary to loop dislocations by means of migration so that the ground layer 14a will not directly take over the crystallinity of the buffer layer 12. As such a material, the abovementioned GaN-based compound semiconductors including Ga can be enumerated. In particular, AlGaN or GaN is suitable.

The thickness of the ground layer 14a is preferably set within a range of 0.1 to 8 μm in terms of providing a ground layer having excellent crystallinity, and more preferably a range of 0.1 to 2 μm in terms of reduction of the processing time required for the film formation and improvement of the productivity.

As required, the ground layer 14a may be doped with a donor impurity (an n-type impurity) within a range of $1 \times 10^{17}$ to $1 \times 10^{19}$/cm$^3$, or undoped ($<1 \times 10^{17}$/cm$^3$), although it is preferably undoped in terms of maintenance of excellent crystallinity. If the substrate 11 is electrically conductive, electrodes can be formed on and below the light-emitting device by doping a dopant into the ground layer 14a to make it electrically conductive. On the other hand, if an insulating material is used for the substrate 11, a chip structure is taken in which a positive electrode and a negative electrode are both disposed on the same surface of the light-emitting device. Hence, the layer directly above the substrate 11 is preferably an undoped crystal for better crystallinity. The type of the n-type impurity is not particularly limited. Examples thereof include Si, Ge, and Sn, and preferably Si and Ge.

[N-Type Contact Layer]

The n-type contact layer 14*b* of the present embodiment is made of a Group III nitride semiconductor, and is formed by laminating on the ground layer 14*a* by a reactive sputtering method.

The n-type contact layer 14*b* is preferably composed of an $Al_xGa_{1-x}N$ layer ($0 \le x \le 1$, preferably $0 \le x \le 0.5$, and more preferably $0 \le x \le 0.1$), similarly to the ground layer 14*a*. In addition, an n-type impurity is preferably doped therein. The n-type impurity is preferably contained at a concentration of $1 \times 10^{17}$ to $1 \times 10^{19}/cm^3$, and preferably $1 \times 10^{18}$ to $1 \times 10^{19}/cm^3$, in terms of maintenance of excellent ohmic contact with the negative electrode, prevention against cracking, and maintenance of excellent crystallinity. The type of the n-type impurity is not particularly limited. Examples thereof include Si, Ge, and Sn, and preferably Si and Ge. The growth temperature is similar to that of the ground layer. In addition, as described above, the n-type contact layer 14*b* may also function as a ground layer.

The gallium nitride-based compound semiconductors respectively constituting the ground layer 14*a* and the n-type contact layer 14*b* preferably have the same composition. Preferably, the total film thickness of these layers is set within a range of 0.1 to 20 μm, preferably 0.5 to 15 μm, and more preferably 1 to 12 μm. If the total film thickness is within such a range, the crystallinity of the semiconductor can be kept excellent.

[N-Type Clad Layer]

The n-type clad layer 14*c* is preferably provided between the above-mentioned n-type contact layer 14*b* and the light-emitting layer 15 described in detail later. By providing the n-type clad layer 14*c*, non-flatness occurring in the outermost surface of the n-type contact layer 14*b* can be improved. The n-type clad layer 14*c* can be formed of AlGaN, GaN, GaInN, or the like, through a conventionally known MOCVD method. In addition, the n-type clad layer 14*c* may also take a superlattice structure having a heterojunction, or multiple laminations, of these structures. In the case of GaInN, it is needless to say that the band gap of the n-type clad layer 14*c* is desirably greater than that of the GaInN of the light-emitting layer 15.

The thickness of the n-type clad layer 14*c* is not particularly limited, although it is preferably within a range of 5 to 500 nm, and more preferably 5 to 100 nm.

Moreover, the dopant concentration of an n-type impurity in the n-type clad layer 14*c* is preferably within a range of $1 \times 10^{17}$ to $1 \times 10^{20}/cm^3$, and more preferably $1 \times 10^{18}$ to $1 \times 10^{19}/cm^3$. The dopant concentration is preferably within this range in terms of maintenance of excellent crystallinity and reduction of the operating voltage of the light-emitting device.

[Light-Emitting Layer]

The light emitting layer 15 is a layer which is laminated on the n-type semiconductor layer 14, as well as being a layer on which the p-type semiconductor layer 16, details of which will be described later, is laminated. The light emitting layer 15 can be formed by a conventionally known MOCVD method. In addition, as shown in FIG. 1, the light emitting layer 15 has a structure in which each of the barrier layers 15*a* made of a gallium nitride-based compound semiconductor, and well layers 15*b* made of an indium-containing gallium nitride-based compound semiconductor is laminated alternately and repeatedly. In the illustrated example, the barrier layers 15*a* are arranged at both sides of the n-type semiconductor layer 14 and the p-type semiconductor layer 16.

As the barrier layer 15*a*, for example, a gallium nitride-based compound semiconductor such as $Al_cGa_{1-c}N$ ($0 \le c < 0.3$) whose band gap energy is greater than that of the well layer 15*b* made of an indium-containing gallium nitride-based compound semiconductor is preferably used.

In addition, for the well layer 15*b*, for example, a gallium nitride indium such as $Ga_{1-s}In_sN$ ($0 \le s \le 0.4$) can be used as the indium-containing gallium nitride-based compound semiconductor.

The total thickness of the light-emitting layer 15 is not particularly limited. For example, the thickness of the light-emitting layer 15 is preferably within a range of 1 to 500 nm, and more preferably the thickness is 1 nm or more and 400 nm or less. The film thickness within the above range contributes to improvement of the light emission output.

[P-Type Semiconductor Layer]

The p-type semiconductor layer 16 is normally comprised of a p-type clad layer 16*a* and a p-type contact layer 16*b*, and is formed on the light-emitting layer 15 using a conventionally known MOCVD method or a reactive sputtering method. In addition, the p-type contact layer may also function as the p-type clad layer.

The p-type semiconductor layer 16 of the present embodiment is doped with an acceptor impurity as a dopant for controlling the conductivity to p-type. The type of the acceptor impurity is not particularly limited, although Mg is preferably used. Moreover, similarly, Be or Zn may also be used.

[P-Type Clad Layer]

The p-type clad layer 16*a* is not particularly limited as long as the composition allows a greater band gap energy than that of the light-emitting layer 15, and carrier confinement in the light-emitting layer 15 can be achieved, although $Al_dGa_{1-d}N$ ($0 < d \le 0.4$, and preferably $0.1 \le d \le 0.3$) is preferred. The p-type clad layer 16*a* is preferably composed of such AlGaN in terms of carrier confinement in the light-emitting layer 15.

The thickness of the p-clad layer 16*a* is not particularly limited, although it is preferably 1 to 400 nm and more preferably 5 to 100 nm.

The p-type dopant concentration, resulting from the addition of the acceptor impurity into the p-type clad layer 16*a*, is preferably set within a range of $1 \times 10^{18}$ to $1 \times 10^{21}/cm^3$, and more preferably $1 \times 10^{19}$ to $1 \times 10^{20}/cm^3$. If the p-type dopant concentration is within the above range, an excellent p-type crystal can be obtained without lowering the crystallinity.

[P-Type Contact Layer]

The p-type contact layer 16*b* is a gallium nitride-based compound semiconductor layer containing at least $Al_eGa_{1-e}N$ ($0 \le e < 0.5$, preferably $0 \le e \le 0.2$, and more preferably $0 \le e \le 0.1$). The Al composition is preferably within the above range in terms of maintenance of excellent crystallinity and excellent ohmic contact with the p-ohmic electrode (refer to a transparent electrode 17 that will be described later).

The thickness of the p-type contact layer 16*b* is not particularly limited, although it is preferably 10 to 500 nm and more preferably 50 to 200 nm. The film thickness is preferably within this range in terms of light emission output.

In addition, the p-type dopant concentration, resulting from the addition of the acceptor impurity into the p-type contact layer 16*b*, is preferably set within a range of $1 \times 10^{18}$ to $1 \times 10^{21}/cm^3$, and more preferably $5 \times 10^{19}$ to $5 \times 10^{20}/cm^3$, in terms of maintenance of excellent ohmic contact, prevention against cracking, and maintenance of excellent crystallinity.

<Manufacturing Method>

As described above, the method for manufacturing a Group III nitride semiconductor according to the present embodiment comprises a sputtering step of forming at least a single-crystalline Group III nitride semiconductor doped with a donor impurity on a substrate 11 by a reactive sputtering method in a chamber 41 in which a substrate 11 and a Ga element-containing target 47 are disposed, wherein said sputtering step includes respective substeps of: a first sputtering step of performing a film formation of the Group III nitride semiconductor while setting the temperature of the substrate 11 to a temperature T1; and a second sputtering step of continuing the film formation of the Group III nitride semiconductor while lowering the temperature of the substrate 11 to a temperature T2 which is lower than the temperature T1.

In the manufacturing method of the present embodiment, upon formation of the laminated semiconductor 10 as shown in FIG. 1 by epitaxially growing a Group III nitride semiconductor crystal on the substrate 11, the buffer layer 12 is formed on the substrate 11, and the semiconductor layer 20 is formed thereon. In the present embodiment, the buffer layer 12 is formed by a reactive sputtering method, and the ground layer 14a of the n-type semiconductor layer 14 and the n-type contact layer 14b are formed thereon by a reactive sputtering method. Subsequently, the n-type clad layer 14c is formed by a conventionally known MOCVD method, and the light-emitting layer 15, and the p-type clad layer 16a and the p-type contact layer 16b which constitute the p-type semiconductor layer 16 are respectively formed thereon by a conventionally known MOCVD method.

Then, in the present embodiment, the ground layer 14a, which is comprised of the n-type semiconductor layer 14 and is laminated on the buffer layer 12, is formed form a Group III nitride semiconductor by a reactive sputtering method in the manufacturing method, details of which will be described later.

[Sputtering Apparatus]

Figure 5:
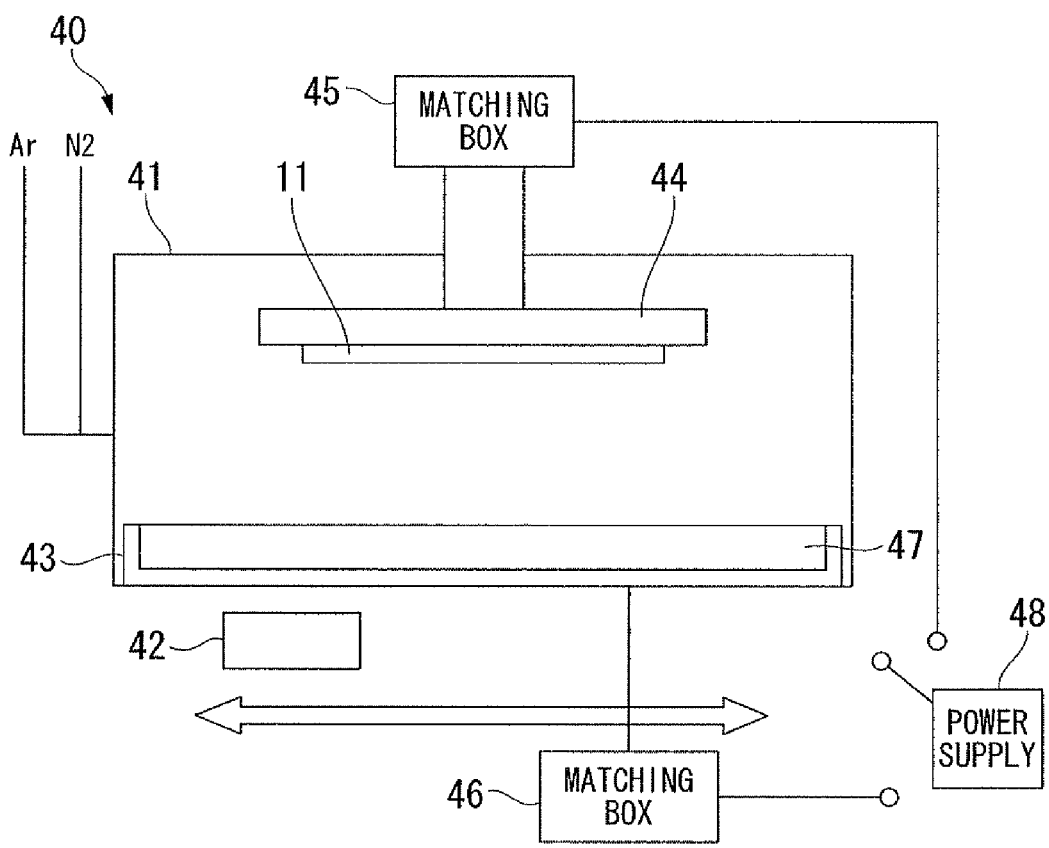
FIG. 5 is a schematic diagram for explaining an example of a method for manufacturing a Group III nitride semiconductor according to the present invention, showing a structure of a sputtering apparatus.

Hereunder is a detailed description of the structure of the sputtering apparatus which forms the respective films of the ground layer 14a and the n-type contact layer 14b with reference to the sputtering apparatus 40 shown in FIG. 5.

The sputtering apparatus 40 shown in FIG. 5 is an example of the RF discharge magnetron sputtering apparatus. The Ga element-containing target 47 is disposed on the electrode 43 in the chamber 41. The magnet 42 is provided underneath the electrode 43 (lower side of FIG. 5), and is swung underneath the target 47 by an unillustrated drive unit. A nitrogen gas and an argon gas are fed into the chamber 41, and the respective layers are formed on the substrate 11 that is mounted on the heater 44.

The electrode 43 is connected to the matching box 46. In addition, the heater plate 44 is equipped with the substrate 11 and connected to the matching box 45. The respective matching boxes 46 and 45 are connected to the power supply 48. An electric current is provided to the electrode 43 through the matching box 46, and an electric current is provided to the heater plate 44 through the matching box 45. Thus, power is applied to the target 47, and bias is applied to the substrate 11. The above matching boxes 46 and 45 are provided so as to perform matching of the impedances of the inside of the sputtering apparatus 40 and the high-frequency power supply 48.

When a semiconductor layer comprised of a Group III nitride semiconductor is formed by a sputtering method, a reactive sputtering method is generally employed in which a Group III metal is used as a target, and a nitrogen atom-containing gas (nitrogen gas: $N_2$, ammonia: $NH_3$, or the like) is introduced into a chamber of a sputtering apparatus to effect reaction between the Group III metal and nitrogen in the vapor phase. As the sputtering method, RF sputtering and DC sputtering may be exemplified. However, when a reactive sputtering method is employed as with the manufacturing method according to the present invention, DC sputtering which brings about continuous discharging causes severe electrification, which makes it difficult to control the film formation rate. Accordingly, in the manufacturing method according to the present invention, it is preferable to employ the RF sputtering method. When the DC sputtering method is used, it is preferable to use a sputtering apparatus which employs a pulsed DC sputtering method which is capable of providing a pulsed bias.

In addition, when the RF sputtering is employed, the position of a magnet is preferably moved in the target as a method for avoiding electrification. The specific moving method can be selected according to the sputtering apparatus to be used. The movement can include swinging, rotation, and the like.

In the sputtering apparatus 40 exemplified in FIG. 5, a magnet 42 is provided underneath the target 47 so that this magnet 42 can be rotated underneath the target 47.

When a semiconductor layer composed of a Group III nitride semiconductor is formed by sputtering, reactive species of higher energy are preferably supplied to the substrate. For this reason, the structure in the sputtering apparatus 40 is preferably such that the substrate 11 is positioned in the plasma and the target 47 and the substrate 11 are in a positional relation facing each other. Moreover, the distance between the substrate 11 and the target 47 is preferably set within a range of 10 to 100 mm.

In addition, it is preferable to leave as few impurities as possible in the chamber 41. Therefore, the ultimate vacuum of the sputtering apparatus 40 is preferably $1.0 \times 10^{-3}$ Pa or less.

Although there is no illustration, a dopant feeder may be provided in the chamber 41 of the sputtering apparatus 40, and the respective layers may be formed while a dopant such as a donor impurity or an acceptor impurity is added to a Group III nitride semiconductor. In addition, a target may be preliminarily mixed with a dopant, and then the film formation may be performed. In addition, it is possible to prepare the structure in which a dopant and other compounds are fed from the outside of the chamber into the inside of the chamber.

[Formation of Laminated Semiconductor]

Hereunder is a detailed description of the film formation method of the respective layers when the laminated semiconductor 10 shown in FIG. 1 is formed by using the manufacturing method of the present embodiment.

[Formation of Buffer Layer]

It is preferable that the manufacturing method of the present embodiment include a buffer layer formation step in which a buffer layer 12 is formed on the substrate 11 by the reactive sputtering method.

In addition, it is preferable that the manufacturing method of the present embodiment include a pretreatment step in which the substrate 11 is subjected to a pretreatment using a sputtering method or the like after the substrate 11 had been introduced in a reactor (sputtering apparatus) and before the buffer layer 12 is formed.

Specifically, the pretreatment step is a step in which the surface can be conditioned by exposing the substrate 11 to a plasma of Ar or $N_2$. For example, by treating the surface of the substrate 11 with a plasma of an Ar gas, an $N_2$ gas, or the like, organic materials and oxides adhered onto the surface of the substrate 11 can be removed. In this case, if an electrical voltage is applied between the substrate 11 and the chamber, plasma will act efficiently on the substrate 11. By applying such a pretreatment to the substrate 11, the buffer layer 12 can be formed all over the surface 11a of the substrate 11, which enables improvement of the crystallinity of a film to be formed thereon. In addition, when the buffer layer 12 is formed on the substrate 11, the substrate 11 may also be subjected to a wet-type pretreatment. For example, the film-forming process can be stabilized by performing hydrogen-termination using a well known RCA washing method on the surface of the substrate 11 made of silicon.

In the pretreatment step of the present embodiment, the method is used in which the surface of the substrate 11 is plasma-treated in the atmosphere in which an ion component and a charge-free radical component are mixed.

For example, when an ion component or the like is singularly fed onto the surface of the substrate to remove a contaminant or the like from the surface of the substrate, an energy is too strong, and the surface of the substrate is damaged. Therefore, there is a problem that the quality of a crystal, which is grown on the substrate, deteriorates.

In the pretreatment step of the present embodiment, as described above, the substrate 11 is subjected to reactive species with an appropriate energy by using the plasma-treatment in the atmosphere in which an ion component and a radical component are mixed. Thus, a contaminant or the like can be removed without damaging the surface of the substrate 11. The mechanism which can obtain these effects is considered as follows: the damage on the surface of the substrate is suppressed by using the plasma in which the ratio of an ion component is small; and a contaminant or the like can be efficiently removed by subjecting the surface of the substrate to the plasma.

After the pretreatment on the surface of the substrate 11 in the pretreatment step, an argon gas and a nitrogen gas are introduced into the sputtering apparatus, and the temperature of the substrate 11 is set at about 500° C. Then, the buffer layer 12 made of AlN is formed on the substrate 11 while applying a high frequency bias to the substrate 11 side, applying power to the side of the Al target made of a metal Al, and keeping the constant pressure in the reactor.

As the method for forming the buffer layer 12 on the substrate 11, for example, a MOCVD method, a pulsed laser deposition (PLD) method, a pulsed electron deposition (PED) method, and the like can be enumerated in addition to the sputtering method. These methods may be appropriately selected for use, although the sputtering method is a preferred method since it is most convenient and suitable for mass production. If a DC sputtering method is employed, the target surface may be so charged that the film formation rate becomes unstable. Therefore, a pulsed DC sputtering method or an RF sputtering method is desirably employed. In addition, in the film formation process of the buffer layer 12, the above sputtering apparatus 40 can be used by changing the target or the respective film formation conditions.

[Formation of Semiconductor Layer]

The semiconductor layer 20 comprised of a Group III nitride semiconductor is formed by sequentially laminating the n-type semiconductor layer 14, the light-emitting layer 15, and the p-type semiconductor layer 16 in this order on the buffer layer 12. As described above, in the manufacturing method of the present embodiment, the ground layer 14a of the n-type semiconductor layer 14 and the n-type contact layer 14b are formed by a reactive sputtering method. Then, the n-type clad layer 14c is formed by a conventionally known MOCVD method, and the light-emitting layer 15 is formed thereon by a MOCVD method. Then, the p-type clad layer 16a and the p-type contact layer 16b which constitute the p-type semiconductor layer 16 are respectively formed thereon by a MOCVD method.

In the MOCVD method, hydrogen ($H_2$) or nitrogen ($N_2$) is employed as a carrier gas, trimethylgallium (TMG) or triethylgallium (TEG) is employed as a Ga (Group III element) source, trimethylaluminum (TMA) or triethylaluminum (TEA) is employed as an Al (Group III element) source, trimethylindium (TMI) or triethylindium (TEI) is employed as an In (Group III element) source, and ammonia ($NH_3$), hydrazine ($N_2H_4$), or the like is employed as an N (Group V element) source. In addition, as the n-type impurity serving as the dopant, monosilane ($SiH_4$) or disilane ($Si_2H_6$) may be employed as a Si source, and an organic germanium compound such as germane gas ($GeH_4$), tetramethylgermanium (($CH_3$)$_4$Ge), or tetraethylgermanium (($C_2H_5$)$_4$Ge) may be employed as a Ge source. In the MBE method, a germanium element may also be employed as a source of dopant. For example, as the p-type impurity serving as the dopant, bis(cyclopentadienyl)magnesium ($Cp_2Mg$) or bis(ethylcyclopentadienyl)magnesium (($EtCp$)$_2Mg$) is employed as an Mg source.

The above gallium nitride-based compound semiconductor may contain any other Group III element other than Al, Ga, and In, and may also contain, if necessary, a dopant element such as Ge, Si, Mg, Ca, Zn, or Be. Furthermore, in some cases, such a gallium nitride-based compound semiconductor contains not only intentionally added elements, but also impurities inevitably contained depending on the film formation conditions, and the like, and trace amounts of impurities contained in raw materials and reaction tube materials.

When the semiconductor layer is formed on the substrate 11 using the above sputtering apparatus 40, firstly, reactive gases such as an argon gas and a nitrogen gas are introduced into the chamber 41. Subsequently, the heater plate 44 is heated by an unillustrated heater installed in the heater plate 44. Then, the substrate 11 is heated to a predetermined temperature, i.e. a growth temperature for the respective layers grown on the substrate 11, and the film formations of the respective layers are performed.

{Reactive Sputtering Film Formation Conditions}

In the present embodiment, among the respective layers of the semiconductor layer 20, the ground layer 14a and the n-type contact layer 14b, which are included in the n-type semiconductor layer 14, are formed by the reactive sputtering method. The film formation of a semiconductor layer using the reactive sputtering method can be performed under the following film formation conditions. During the formation of a semiconductor layer made of a Group III nitride semiconductor with use of the reactive sputtering method, other important parameters include the partial pressure of the nitrogen atom-containing gas, the film formation rate, the substrate temperature, the bias, and the power.

Firstly, the gas atmosphere in the chamber 41 of the sputtering apparatus 40 is mixed with the nitrogen atom-containing gas (such as a $N_2$ gas (nitrogen) or a $NH_3$ gas). The nitrogen atom-containing gas is decomposed by a plasma into nitrogen atoms which are the raw material for crystal growth. In addition, in order to efficiently sputter the target 47, the gas atmosphere is mixed with a low-reactive inert gas of large molecular weight such as argon (Ar).

The ratio of the nitrogen atom-containing gas in the gas atmosphere in the chamber 41, e.g. the ratio of a nitrogen gas flow rate to the total flow rate of a nitrogen gas ($N_2$) and argon (Ar), can be set within a range of 20% to 98%. If the flow rate ratio of a nitrogen gas is lower than 20%, the sputtering raw material may remain adhered in the form of metal. If the flow rate ratio of a nitrogen gas is higher than 98%, the argon amount is so little that the sputtering rate is lowered.

In addition, in order to laminate a Group III nitride semiconductor having particularly excellent crystallinity, it is preferable that the ratio of the nitrogen atom-containing gas in the atmosphere in the chamber 41 be set within a range of 20% to 80% and the balance be made of a gas containing an inert gas.

A gas containing an inert gas may contain a hydrogen gas ($H_2$) or the like in addition to an inert gas such as Ar.

In addition, the film formation rate during the formation of the semiconductor layer made of a Group III nitride semiconductor with use of the reactive sputtering method is preferably set within a range of 0.01 to 10 nm/second. If the film formation rate exceeds 10 nm/second, a laminated Group III nitride semiconductor does not form a crystal but become amorphous. If the film formation rate is lower than 0.01 nm/second, the process wastefully takes a long time, and the application to industrial production becomes difficult.

As a result of intensive studies conducted by the inventors of the present invention regarding the temperature during the formation of the semiconductor layer made of a Group III nitride semiconductor, it has been revealed that generally the substrate temperature is set preferably within a range of 600° C. to 1,200° C. so as to form a semiconductor layer composed of a Group III nitride semiconductor having excellent crystallinity by a sputtering method. If the substrate temperature is lower than 600° C., migration of reactive species on the surface of the substrate is suppressed, which makes it difficult to form a Group III nitride semiconductor having excellent crystallinity. In addition, if the substrate temperature exceeds 1,200° C., the formed Group III nitride semiconductor may be decomposed again.

Moreover, in order to easily control the conductivity of a semiconductor layer by doping with a dopant such as a donor impurity or an acceptor impurity, the substrate temperature is preferably set within a range of 600° C. to 1,050° C. By setting the substrate temperature within a range of 600° C. to 1,050° C., a Group III nitride semiconductor having a lower defect density of point defects or the like and excellent crystallinity can be grown. By so doing, the conductivity of a Group III nitride semiconductor can be easily controlled by doping with a dopant.

In addition, as described above, the manufacturing method of the present embodiment includes: the first sputtering step in which a film formation of a Group III nitride semiconductor is performed while setting the temperature of the substrate 11 to a temperature T1; and the second sputtering step in which the film formation of a Group III nitride semiconductor is continued while lowering the temperature of the substrate 11 to a temperature T2 which is lower than the temperature T1, for the film formation of the ground layer 14a. Although the temperatures T1 and T2 of the substrate 11 in the manufacturing method will be described in details later, the temperature T1 is preferably set within a range of 800° C. to 1,100° C., and the temperature T2 is preferably set within a range of 700° C. to 1,000° C.

In order to activate the migration of reactive species on the surface of the substrate 11 during the growth of crystal, a bias to be applied to the substrate 11 side and a power to be applied to the target 47 side are preferably greater. For example, the bias to be applied to the substrate 11 side upon film formation is preferably 1.5 W/cm$^2$ or greater, and the power to be applied to the target 47 side upon film formation is preferably set within a range of 1.5 W/cm$^2$ to 5 kW/cm$^2$.

The composition of the semiconductor layer made of a Group III nitride semiconductor can be controlled by adjusting the composition of the Group III metal used as the target at a desired value. For example, a Ga metal may be used as the target upon formation of a layer made of GaN, and an AlGa alloy may be used as the target upon formation of an AlGaN layer. Moreover, an InGa alloy may be used upon formation of an InGaN layer. Since the composition of the Group III nitride semiconductor can be changed according to the composition of the Group III metal of the target 47, a semiconductor layer composed of a Group III nitride semiconductor at a desired composition can be formed by experimentally determining the composition of the target 47.

Alternatively, for example, for laminating an AlGaN layer, both a Ga metal and an Al metal may be provided together as the target. In this case, the composition of the AlGaN layer to be laminated can be controlled by changing the ratio of the surface area between the Ga metal target and the Al metal target. Similarly, for laminating an InGaN layer, both a Ga metal target and an In metal target can be provided together.

[Film Formation Method of Semiconductor Layer]

Hereunder is a description of the procedure for forming the n-type semiconductor 14, the light-emitting layer 15, and the p-type semiconductor layer 16 which constitute the semiconductor layer 20.

(Formation of N-Type Semiconductor Layer)

Firstly, the ground layer 14a made of a Group III nitride semiconductor is formed on the buffer layer 12 which is formed on the substrate 11.

Examples of the method for forming the ground layer 14a made of a single-crystalline Group III nitride semiconductor on the substrate 11 include the method in which the single-crystalline buffer layer made of $Al_yGa_{1-y}N$ ($0 \leq y \leq 1$) is formed by the reactive sputtering method and the single-crystalline GaN layer (ground layer) is formed thereon by the reactive sputtering method as the present embodiment.

When the ground layer 14a is formed by the reactive sputtering method as the present embodiment, the film formation can be performed using the sputtering apparatus 40 which is the same as for the n-type contact layer 14b formed by the sputtering method. In this case, the ground layer is formed without feeding a dopant element that contains a donor impurity (Si) into the chamber 41. Meanwhile, the n-type contact layer 14b and n-type clad layer 14c, which is formed by a MOCVD method, are formed while feeding a dopant element that contains a donor impurity (Si) into the reactor, to thereby obtain the GaN layer whose conductivity has been controlled to n-type with the addition of a donor impurity.

As described above, the present embodiment includes: the first sputtering step in which a film formation of a Group III nitride semiconductor is performed while setting the temperature of the substrate 11 to a temperature T1; and the second sputtering step in which the film formation of a Group III nitride semiconductor is continued while lowering the temperature of the substrate 11 to a temperature T2 which is lower than the temperature T1, for the film formation of the ground layer 14a included in the n-type semiconductor layer 14. In this manner, the two step growth is performed for the film formation of the ground layer 14a which is made of a Group III nitride semiconductor and included in the n-type nitride semiconductor 14. In details, the growth is started while setting the temperature of the substrate 11 to T1, and the film formation is performed for a predetermined time. Then, the temperature of the substrate 11 is lowered to T2, and the film formation is further performed for a predetermined time. Thus, it is possible to obtain high film formation rate, surface morphology, and excellent crystallinity.

Figure 6:
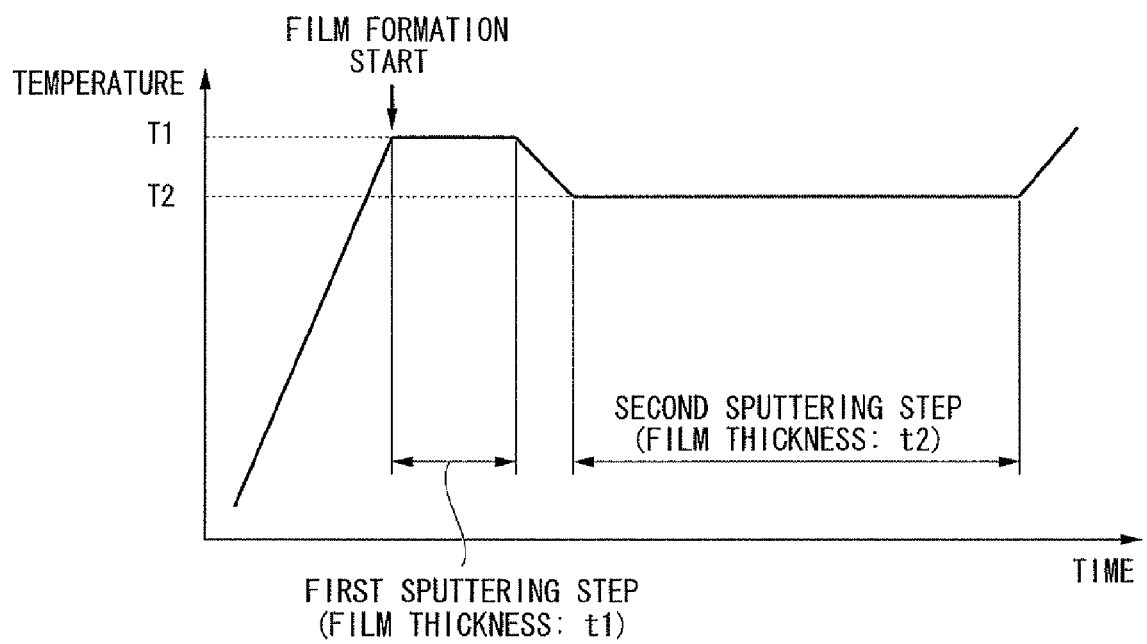
FIG. 6 is a schematic diagram for explaining an example of the method for manufacturing a Group III nitride semiconductor according to the present invention, representing a graph that shows the temperature condition during the film formation of a Group III nitride semiconductor.

In more details, as shown in the graph of FIG. 6, firstly, the film formation of a Group III nitride semiconductor (ground layer 14a) on the buffer layer 12 is started while setting the temperature of the substrate 11 to T1 (° C.) in the first sputtering step. When the film formation is performed at T1 (° C.), the loop of initial dislocation is enhanced by migration, and the state is temporarily prepared in which the dislocation density of the film is reduced. Then, in the second sputtering step, the temperature of the substrate 11 is lowered to T2 (° C.) which is lower than T1 (° C.), and the film formation of a Group III nitride semiconductor is further continued, to thereby increase the film formation rate. Thus, the film formation for a desired thickness can be performed in a short time. In this manner, the temperature of the substrate 11 is set to the high temperature T1 (° C.) in the early stage of the film formation (first sputtering step), to thereby improve the crystallinity of the formed Group III nitride semiconductor. Then, in the late stage of the film formation (second sputtering step), the temperature of the substrate 11 is lowered to T2 (° C.) which is lower than T1 (° C.), and the film formation is continued, to thereby obtain the high film formation rate and surface characteristics. Therefore, it is possible to achieve both of the high production yield and excellent device characteristics.

The temperature T1 of the substrate in the first sputtering step 11 is preferably set within a range of 800° C. to 1,100° C., and the temperature T2 of the substrate 11 in the second sputtering step is preferably set within a range of 700° C. to 1,000° C.

By setting the temperature T1 of the substrate 11 in the first sputtering step within the above range, it is possible to improve the crystallinity of the formed ground layer 14a. In addition, by setting the temperature T2 of the substrate 11 in the second sputtering step within the above range, it is possible to keep the high film formation rate.

In addition, the temperature T1 of the substrate 11 in the first sputtering step and the temperature T2 of the substrate 11 in the second sputtering step preferably satisfy the relationship represented by a following formula: $\{20°\ C. \leq (T1-T2) \leq 300°\ C.\}$, and more preferably a following formula: $\{50°\ C. \leq (T1-T2) \leq 200°\ C.\}$.

In the manufacturing method of the present embodiment, the temperature T2 of the substrate 11 in the second sputtering step is defined as the lower temperature than the temperature T1 of the substrate 11 in the first sputtering step as described above. By defining that the relationship between the temperatures T1 and T2 of the substrate 11 is the relationships represented by the above formulas, it is possible to improve the crystallinity of the formed ground layer 14a and realize the higher film formation rate.

In the present embodiment, it is preferable that the film of the Group III nitride semiconductor with a thickness t1 within a range of 5 to 100 nm be formed while setting the temperature of the substrate 11 to T1 in the first sputtering step. Subsequently, it is preferable that the film of the Group III nitride semiconductor with a thickness t2 of 10 nm or more be formed while lowering the temperature of the substrate 11 to T2 in the second sputtering step. In addition, the total thickness t3 of the ground layer 14a, which is the combination of the above thickness t1 and thickness t2, is preferably 15 nm or more.

By setting the thickness t1 of the Group III nitride semiconductor formed in the first sputtering step within the above range, it is possible to improve the crystallinity of the formed ground layer 14a. In addition, by setting the thickness t2 of the Group III nitride semiconductor formed in the second sputtering step, it is possible to unfailingly obtain a desired thickness in a short time process.

Figure 7:
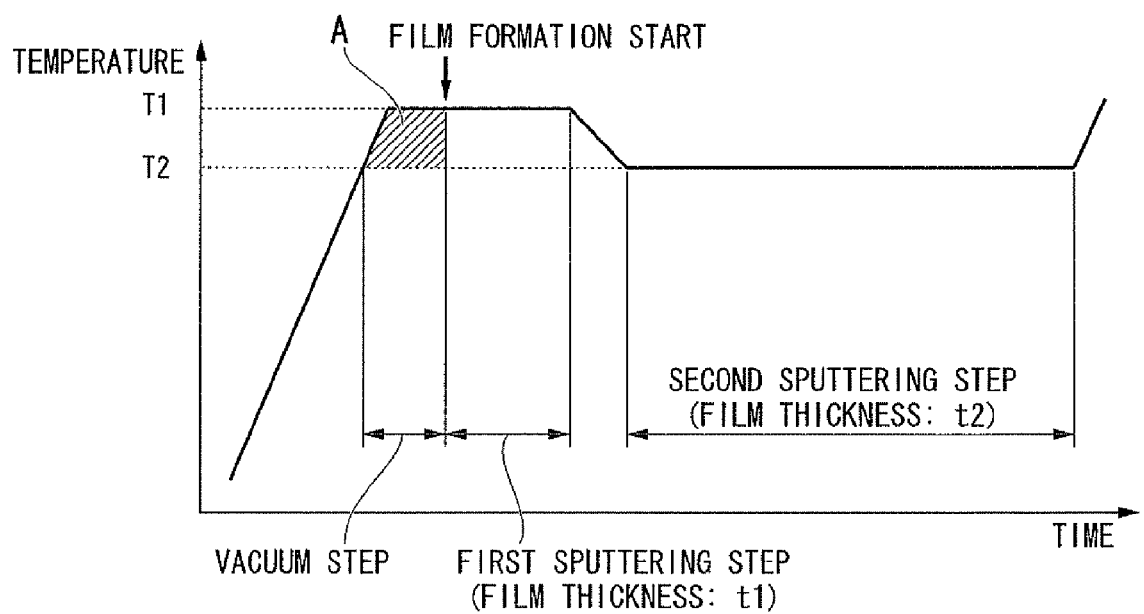
FIG. 7 is a schematic diagram for explaining another example of the method for manufacturing a Group III nitride semiconductor according to the present invention, representing a graph that shows the temperature condition and atmosphere condition during the film formation of a Group III nitride semiconductor.

In addition, as represented by the graph of FIG. 7, the manufacturing method of the present embodiment preferably include a vacuum step of preparing a vacuum state in the chamber 41 and heating the substrate 11 to the temperature T1 in addition to the above steps, and the first sputtering step and second sputtering step is preferably performed in this order following the vacuum step. The vacuum step described in the present embodiment refers to the step in which the substrate 11 is heated while preparing a vacuum state in the chamber 41 at the stage before the temperature of the substrate 11 reaches the temperature T2 that is higher than the temperature T1 and the film formation (the first sputtering step) starts as represented by the region A in the graph of FIG. 7.

In the vacuum step of the present embodiment, as described above, firstly, a vacuum state is prepared in the chamber 41, and the substrate 11 is heated to the temperature T1 by the temperature increase of the heater 44 (the region A shown in FIG. 7). In this manner, by heating the substrate 11 in a vacuum atmosphere before the film formation of a Group III nitride semiconductor, it is possible to preliminarily remove oxygen attached to the surface on exposure to the atmosphere or an oxygen layer or the like which is generated when the surface of the buffer layer 12 adsorbs the oxygen in the chamber 41. Thus, it is possible to form the ground layer 14a made of a Group III nitride semiconductor on the buffer layer 12 as a semiconductor layer having excellent crystallinity.

In addition, a deposition or the like, which is attached to the inside wall or the shielding member of the sputtering apparatus 40, can be preliminarily removed by providing the vacuum step before the first sputtering step. Thus, it is possible to prevent impurities and the like from being mixed in the ground layer 14a formed form a Group III nitride semiconductor.

Thereafter, the substrate 11 is heated to the temperature T1, and the film formation of a Group III nitride semiconductor is performed in the first sputtering step in which the gas atmosphere containing a nitrogen gas ($N_2$) and an argon gas (Ar) is prepared in the chamber 41. Then, the substrate is cooled to the temperature T2, and thereafter, the film formation of a Group III nitride semiconductor is continued in the second sputtering step in which the above gas atmosphere is prepared in the chamber 41 until a desired thickness is achieved. Thus, the ground layer 14a is formed.

In the present embodiment, there is the description of the example in which only one cycle of the above first and second sputtering steps are performed, but the present invention is not limited to this. For example, several cycles of the first and second sputtering steps may be repeatedly performed while decreasing the thickness of a formed film in the each step. Thus, it is possible to further improve the crystallinity of a Group III nitride semiconductor.

In addition, as the vacuum step of the present embodiment, there is the description of the example in which only the substrate 11 is heated while preparing a vacuum state in the chamber 41, but the present invention is not limited to this. For example, the process of the vacuum step can be performed by generating a plasma in the chamber 41 at the same time as the heating of the substrate 11. By so doing, it is possible to further improve the cleaning level of the substrate surface and the crystallinity of a Group III nitride semiconductor formed on the substrate.

According to the manufacturing method of the present embodiment, the film formations of a Group III nitride semiconductor are performed in the above respective steps under the above respective conditions, and therefore, the ground layer 14a with excellent crystallinity can be formed at a high film formation rate.

Then, the n-type contact layer 14b is formed by using the reactive sputtering method on the ground layer 14a formed by the method described above. In this case, as the sputtering apparatus 40 for use in the formation of the n-type contact layer 14b, the sputtering apparatus which is the same as employed in the formation of the ground layer 14a can be employed by changing the respective film formation conditions.

Then, the n-type clad layer 14c is formed on the n-type contact layer 14b by using a conventionally known MOCVD method.

In the present embodiment, the layer made of a Group III nitride semiconductor, whose conductivity has been controlled to n-type, can be formed by adding a donor impurity during the formation of the n-type contact layer 14b and the n-type clad layer 14c. A silicon element (Si) is preferably employed as the above donor impurity, but Ge, Sn, or the like can be employed in addition to Si as described above.

(Formation of Light-Emitting Layer)

The light-emitting layer 15 is formed on the n-type clad layer 14c by a conventionally known MOCVD method. The light-emitting layer 15 to be formed in the present embodiment as exemplified in FIG. 1 has a laminated structure starting from a GaN barrier layer and ending with a GaN barrier layer, which is formed by alternate laminations of six barrier layers 15a made of Si-doped GaN and five well layers 15b made of undoped $In_{0.2}Ga_{0.8}N$.

(Formation of P-Type Semiconductor Layer)

The p-type semiconductor layer 16 comprised of the p-type clad layer 16a and the p-type contact layer 16b is formed on the light-emitting layer 15, that is, a barrier layer 15a serving as the outermost layer of the light-emitting layer 15, with use of a conventionally known MOCVD method. The p-type semiconductor layer 16 of the present embodiment can be formed by the reactive sputtering method.

In the present embodiment, firstly, the p-type clad layer 16a made of Mg-doped $Al_{0.1}Ga_{0.9}N$ is formed on the light-emitting layer 15 (barrier layer 15a serving as the outermost layer), and then the p-type contact layer 16b made of Mg-doped $Al_{0.02}Ga_{0.98}N$ is formed thereon. In the film formation of the p-type semiconductor layer 16 comprised of the p-type clad layer 16a and the p-type contact layer 16b, for example, a dopant element comprised of an acceptor impurity is fed into a reactor. Thus, the p-type clad layer 16a and the p-type contact layer 16b, whose conductivities have been controlled to p-type by adding an acceptor impurity, can be obtained.

As an acceptor impurity, a magnesium (Mg) element is preferably used, but Be, Zn, or the like other than Mg can be also used.

By using the acceptor impurity described above as a dopant element, the p-type clad layer 16a and the p-type contact layer 16b can be formed from the p-type GaN single crystal which has the conductivity controlled to p-type and a carrier concentration of $1 \times 10^{16}$ cm$^3$ to $4 \times 10^{16}$ cm$^{-3}$.

According to the method for manufacturing a Group III nitride semiconductor of the present embodiment described above, firstly, a substrate 11 temperature is set to a high temperature, to thereby generate migration. Thus, the loop of initial dislocation is enhanced, and the dislocation density of a crystal is reduced. Then, the film formation rate of a crystal is increased by setting a substrate 11 temperature to a low temperature. Thus, a film having a desired thickness can be formed in a short time. Consequently, a crystal of a Group III nitride semiconductor having excellent crystallinity can be efficiently formed at a high film formation rate.

Therefore, the ground layer 14a, which is made of a Group III nitride semiconductor and has excellent crystallinity, can be stably formed on a substrate by using a sputtering method with high efficiency.

In addition, the manufacturing method of the present embodiment may further include a vacuum step of preparing a vacuum state in the chamber 41 and heating the substrate 11 to the temperature T1, and the first sputtering step and second sputtering step may be performed in this order following the vacuum step. Thus, an oxygen layer or the like, which is generated when the surface of the buffer layer 12 adsorbs the oxygen in the chamber 41, can be preliminarily removed in the vacuum step. As a result, the ground layer 14a can be formed on the buffer layer 12 as a semiconductor layer having excellent crystallinity, and moreover, it is possible to improve the crystallinity of the each layer to be formed thereon.

In addition, a deposition or the like, which is attached to the inside wall or the shielding member of the sputtering apparatus 40, can be preliminarily removed by performing the vacuum step before the first sputtering step. Thus, it is possible to prevent impurities and the like from being mixed in the ground layer 14a.

In the present embodiment, there is a description of an example in which the ground layer 14a included in the n-type semiconductor layer 14 is formed by the manufacturing method that includes the above first sputtering step, second sputtering step, and vacuum step, but the present invention is not limited to this example. For example, the respective layers, which constitute the n-type semiconductor layer 14, can be formed by the manufacturing method that includes these respective steps. In addition, layers other than the p-type semiconductor layer 16 and n-type semiconductor layer 14 can be formed by appropriately using the manufacturing method of the present invention.

The Group III nitride semiconductor obtained by the manufacturing method of the present embodiment can be used for optoelectrical conversion devices that includes light-emitting devices or light receiving devices such as a light emitting diode (LED) and a laser diode (LD), details of which will be described later, and electronic devices such as a heterojunction bipolar transistor (HBT) or a high electron mobility transistor (HEMT). Various structures are known as the structures of these semiconductor devices, and these device structures can be employed as the device structure of the laminated structure of a Group III nitride semiconductor according to the present invention, and there is no limitation.

[Method for Manufacturing a Group III Nitride Semiconductor Light-Emitting Device]

The method for manufacturing a Group III nitride semiconductor light-emitting device according to the present embodiment is a method in which at least a part of the n-type semiconductor layer 14 is formed by the method for manufacturing a Group III nitride semiconductor as mentioned above when a Group III nitride semiconductor light-emitting device (hereinafter may be abbreviated as a light-emitting device) 1 is manufactured, which comprises a semiconductor layer 20 as exemplified in FIG. 3 (also refer to FIG. 1) which is made by laminating the n-type semiconductor layer 14, the light-emitting layer 15, and the p-type semiconductor layer 16 in this order, each layer being comprised of Group III nitride semiconductors.

<Laminated Structure of Light-Emitting Device>

Figure 2:
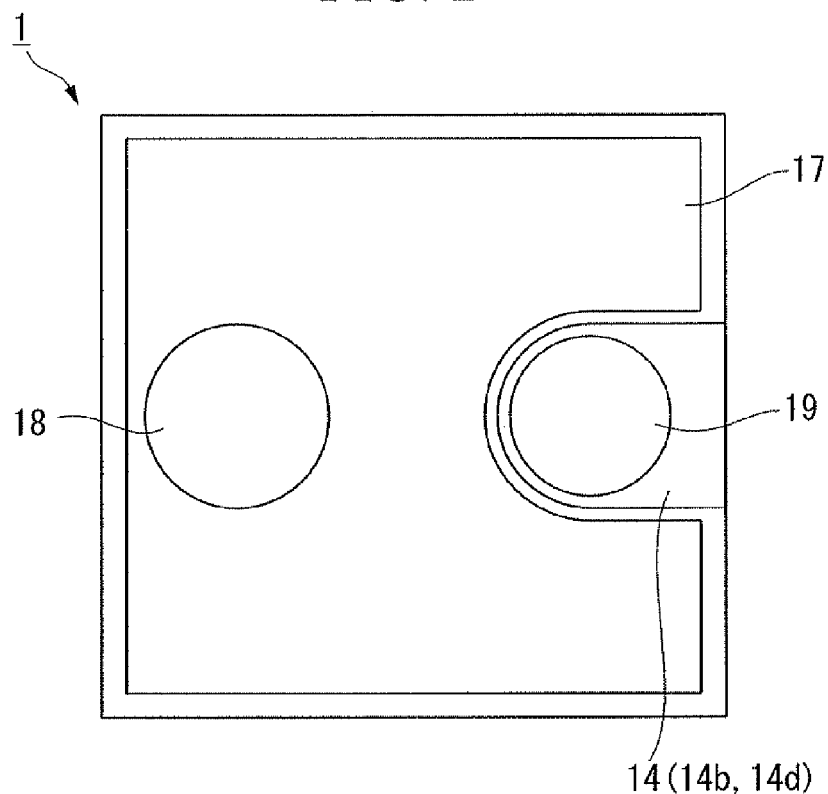
FIG. 2 is a schematic diagram for explaining an example of the Group III nitride semiconductor according to the present invention, showing a planar structure of a light-emitting device constituted by the Group III nitride semiconductor.
Figure 3:
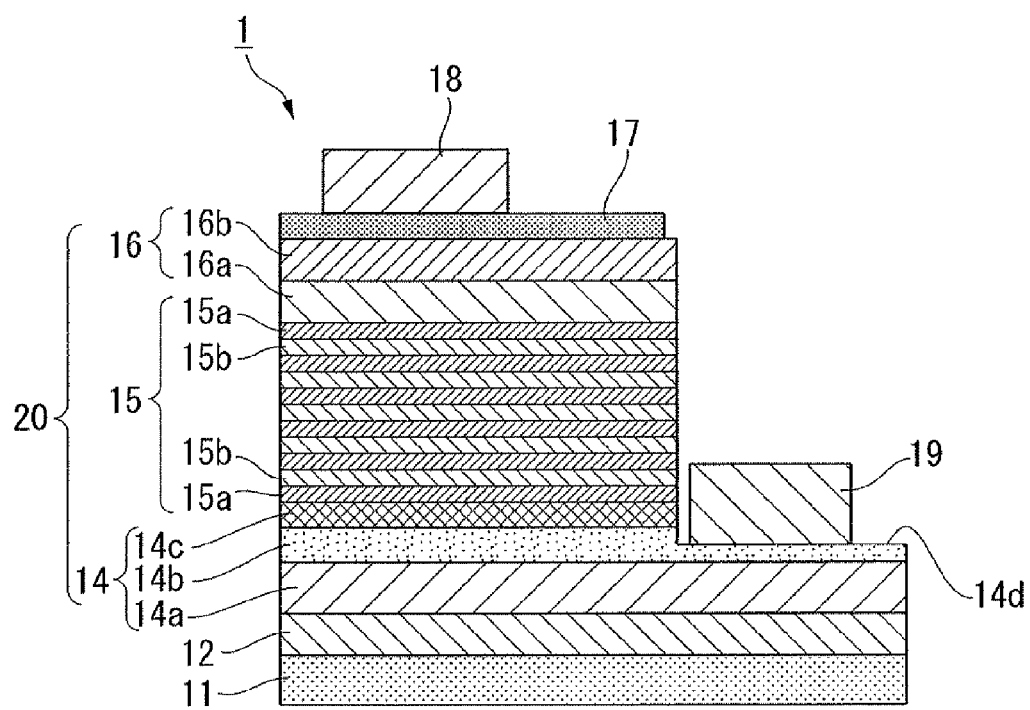
FIG. 3 is a schematic diagram for explaining an example of the Group III nitride semiconductor according to the present invention, showing a cross-sectional structure of the light-emitting device constituted by the Group III nitride semiconductor.

FIG. 2 and FIG. 3 are schematic diagrams for explaining an example of the light-emitting device of the present embodiment, showing an example in which a light-emitting device 1 is constituted by using the laminated semiconductor 10 (refer to FIG. 1) in which respective layers composed of Group III nitride semiconductors are formed on a substrate. FIG. 2 is a plan view and FIG. 3 is a cross-sectional view.

The light-emitting device 1 of the present embodiment schematically comprises a transparent positive electrode 17 laminated on the p-type semiconductor layer 16 of the laminated semiconductor 10 that has been produced by the above manufacturing method, a positive electrode bonding pad 18 formed thereon, and a negative electrode 19 laminated on an exposed area 14*d* that has been formed in the n-type contact layer 14*b* of the n-type semiconductor layer 14.

Moreover, the ground layer 14*a* included in the n-type semiconductor layer 14 of the present embodiment is formed by the method for manufacturing a Group III nitride semiconductor according to the above present embodiment.

[Transparent Positive Electrode]

The transparent positive electrode 17 is a transparent electrode formed on the p-type semiconductor layer 16 (p-type contact layer 16*b*) of the laminated semiconductor 10 mentioned above.

The material of the transparent positive electrode 17 is not particularly limited, and materials such as ITO ($In_2O_3$—$SnO_2$), AZO (ZnO—$Al_2O_3$), IZO ($In_2O_3$—ZnO), and GZO (ZnO—$Ga_2O_3$) can be used through a commonly used means which is well known in this technological field. In addition, the structure thereof may employ any structure including conventionally well known structures without any limitations.

Moreover, the transparent positive electrode 17 may be either formed to cover substantially all over the surface of the Mg-doped p-type semiconductor layer 16 or formed in a lattice shape or branching shape by having spaces.

[Positive Electrode Bonding Pad and Negative Electrode]

The positive electrode bonding pad 18 is an electrode formed on the abovementioned transparent positive electrode 17.

As the material of the positive electrode 18, various structures using Au, Al, Ni, Cu, and the like are well known. The positive electrode bonding pad 18 having these well known materials and structures may be employed without any limitation.

The thickness of the positive electrode bonding pad 18 is preferably within a range of 100 to 1000 nm. Moreover, in terms of the characteristics of the bonding pad, the thickness is preferably larger since the bondability becomes higher. Therefore, the thickness of the positive electrode bonding pad 18 is more preferably 300 nm or more. Furthermore, the thickness is preferably 500 nm or less in terms of the production cost.

The negative electrode 19 is formed to be in contact with the n-type contact layer 14*b* of the n-type semiconductor layer 14, in the semiconductor layer in which the n-type semiconductor layer 14, the light-emitting layer 15, and the p-type semiconductor layer 16 have been sequentially laminated on the substrate 11. Therefore, for forming the negative electrode 19, the p-type semiconductor layer 16, the light-emitting layer 15, and the n-type semiconductor layer 14 are partially removed to thereby expose the exposed area 14*d* in the n-type contact layer 14*b*, on which the negative electrode 19 is formed.

As the material of the negative electrode 19, various compositions and structures are well known. The negative electrodes 19 having these well known compositions and structures may be employed without any limitation. Also, the negative electrodes 19 can be provided through a commonly used means which is well known in this technical field.

<Method for Manufacturing Light-Emitting Device>

Hereunder is a description of an example of the method for manufacturing the light-emitting device 1 as shown in FIG. 2 and FIG. 3.

The method for manufacturing the light-emitting device 1 of the present embodiment is a method in which, using the laminated semiconductor 10 that has been obtained by the above manufacturing method, the transparent positive electrode 17 is laminated on the p-type semiconductor layer 16 of the concerned laminated semiconductor 10, the positive electrode bonding pad 18 is formed thereon, and the negative electrode 19 is laminated on the exposed area 14*d* that has been formed in the n-type contact layer 14*b* of the n-type semiconductor layer 14.

[Formation of Transparent Positive Electrode]

By the abovementioned method, the transparent positive electrode 17 made of ITO is formed on the p-type contact layer 16*b* of the laminated semiconductor 10 in which the buffer layer 12 and the semiconductor layer have been laminated on the substrate 11. The method for forming the transparent positive electrode 17 is not particularly limited, and it can be provided through a commonly used means which is well known in this technological field. In addition, the structure thereof may employ any structure including conventionally well known structures without any limitations.

Moreover, as mentioned above, the material of the transparent positive electrode 17 is not limited to ITO, and it is possible to form this using materials such as AZO, IZO, and GZO. Furthermore, after the formation of the transparent positive electrode 17, thermal annealing for the purpose of alloying or transparent finishing may be either applied or not applied.

[Formation of Positive Electrode Bonding Pad and Negative Electrode]

The positive electrode bonding pad 18 is further formed on the transparent positive electrode 17 that has been formed on the laminated semiconductor 10. This positive electrode bonding pad 18 can be formed by laminating respective materials of Ti, Al, and Au, for example, from the surface side of the transparent positive electrode 17 through a conventionally well known method.

In addition, upon formation of the negative electrode 19, firstly, the exposed area 14*d* (refer to FIG. 2 and FIG. 3) is formed in the n-type contact layer 14*b* by partially removing the p-type semiconductor layer 16, the light-emitting layer 15, and the n-type semiconductor layer 14 that has been formed on the substrate 11, by a method such as dry etching.

Then, on this exposed area 14*d*, the negative electrode 19 of a four layer structure can be formed by laminating respective materials of Ni, Al, Ti, and Au, for example, from the surface side of the exposed area 14*d* through a conventionally well known method.

Then, the wafer in which the transparent positive electrode 17, the positive electrode bonding pad 18, and the negative electrode 19 have been provided on the laminated semiconductor 10 in the abovementioned manner, is subjected to grinding and polishing on the backside of the substrate 11 to make a mirror-like plane, followed by cutting into a 350-μm-square piece, for example. By so doing, a light-emitting device chip (light-emitting device 1) can be formed.

According to the method for manufacturing a Group III nitride semiconductor light-emitting device of the present embodiment as described above, the ground layer 14*a* included in the n-type semiconductor layer 14 is formed from the single-crystalline Group III nitride semiconductor by the above manufacturing method. Therefore, a Group III nitride semiconductor light-emitting device can be obtained which comprises an n-type semiconductor layer comprised of a Group III nitride semiconductor having controlled conductivity and excellent crystallinity, and has excellent light emission characteristics.

[Lamp]

A lamp can be constituted through means well known to those skilled in the art by combining the Group III nitride semiconductor light-emitting device of the present invention as explained above with a phosphor. Hitherto, a technique of changing emission colors by combining a light-emitting device with phosphors has been known, and such techniques can be employed without any limitations.

For example, it becomes possible to emit light having a wavelength longer than that of a light-emitting device by properly selecting a phosphor, and further, it is also possible to provide a lamp which can emit white light by mixing a light emitting wavelength of the light-emitting device itself and a wavelength converted by a phosphor.

Moreover, the lamp may be used for any application, such as a bullet shape type for general use, a side view type for use in a back light for a portable display, and a top view type for use in an indicator.

Figure 4:
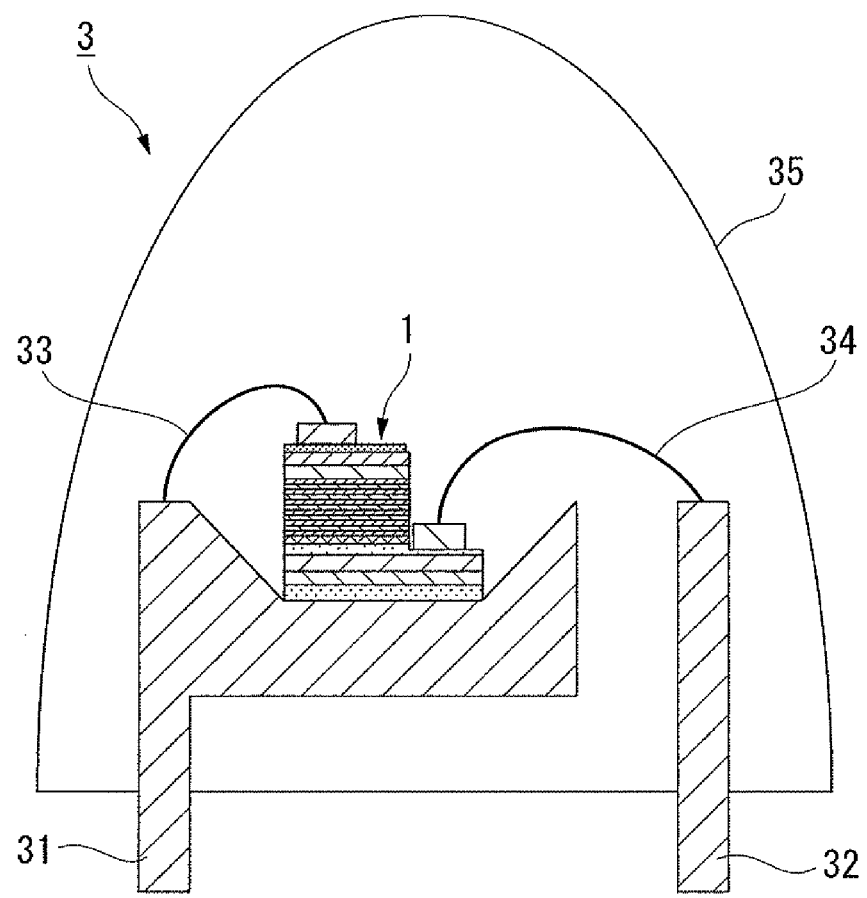
FIG. 4 is a schematic diagram for explaining a lamp constituted by using the Group III nitride semiconductor light-emitting device according to the present invention.

For example, as in the example shown in FIG. 4, when the Group III nitride semiconductor light-emitting device 1 of a type having electrodes on the same surface is to be mounted in a projectile shape: the light-emitting device 1 is bonded to either one of two frames (frame 31 in FIG. 4); a negative electrode of the light-emitting device 1 (refer to reference symbol 19 shown in FIG. 3) is connected to the frame 32 through a wire 34; and a positive electrode bonding pad of the light-emitting device 1 (refer to reference symbol 18 shown in FIG. 3) is connected to the frame 31 through a wire 33. Then, the surroundings of the light-emitting device 1 are sealed with a mold 35 made of a transparent resin. By so doing, the projectile-shaped lamp 3 as shown in FIG. 4 can be produced.

The lamp 3 of the present embodiment uses the light-emitting device 1 which is formed on the ground layer 14a included in the n-type semiconductor layer 14 by the manufacturing method of the above present embodiment, and therefore has excellent light emission characteristics.

EXAMPLES

Next is a more detailed description of the method for manufacturing a Group III nitride semiconductor and the method for manufacturing a Group III nitride semiconductor light-emitting device of the present invention, with reference to Examples. It should be noted that the present invention is not to be limited to these examples.

In present Examples, the respective layers were formed on the substrate 11, and consequently, the laminated semiconductor 10 of the Group III nitride semiconductor light-emitting device was produced which had the cross-sectional structure as represented by the schematic cross-sectional diagram shown in FIG. 1. The respective electrodes were formed for this laminated semiconductor 10, to thereby make the light-emitting device 1. In present Examples, the single-crystalline layer made of AlN was formed on the c plane of the substrate 11 made of sapphire by the RF sputtering method as the buffer layer 12. The ground layer 14a made of the single-crystalline GaN was formed thereon by the reactive sputtering method as the n-type semiconductor layer 14. The n-type contact layer 14b doped with the donor impurity was formed on the ground layer 14a by the reactive sputtering method, and then the n-type clad layer 14c was formed on the n-type contact layer 14b by the MOCVD method. Then, the light-emitting layer 15 was formed thereon by the MOCVD method, and the respective p-type clad layer 16a and p-type contact layer 16b were laminated in this order on the light-emitting layer 15 by the MOCVD method as the p-type semiconductor 16, to thereby produce the laminated semiconductor sample.

Example 1

In Example 1, according to the following procedure, the buffer layer 12 was formed on the substrate 11 by using the reactive sputtering method, and then the GaN layer (ground layer 14a) was formed thereon by using the reactive sputtering method.

[Formation of Buffer Layer]

At first, the substrate 11 made of sapphire having a (0001) c plane of a diameter of 2 inches, the surface of which had been mirror finished, was washed with hydrofluoric acid or organic solvent, and was then introduced into a chamber of a sputtering apparatus. Here, as the sputtering apparatus, there was employed an apparatus having a high frequency-type power supply, and a mechanism capable of moving a position influenced by the magnetic field, through rotation of a magnet within a target.

The substrate 11 was heated to 500° C. in the chamber of the sputtering apparatus, into which a nitrogen gas was introduced at a flow rate of 15 sccm. Then, while keeping the pressure in the chamber at 1.0 Pa and applying a high frequency bias of 50 W to the substrate 11, the substrate 11 was exposed to a nitrogen plasma to thereby effect washing of the surface thereof.

Subsequently, an argon gas and a nitrogen gas were introduced into the chamber, and then the temperature of the substrate 11 was lowered to 500° C. Under conditions where a bias was not applied to the substrate 11 side, a high frequency power of 2000 W was applied to the metal Al target side, the pressure in the reactor was maintained at 0.5 Pa, the Ar gas was circulated at a flow rate of 5 sccm, and the nitrogen gas was circulated at a flow rate of 15 sccm (nitrogen ratio in the total gas was 75%), a buffer layer 12 made of AlN was formed on the substrate 11 made of sapphire. The growth rate at this time was 0.12 nm/s.

The magnet in the target was rotated at both timings of the washing of the substrate 11 and the formation of the buffer layer 12. On completion of formation of the buffer layer made of AlN with a thickness of 50 nm in the above manner, the plasma operation was stopped. From the above procedure, the buffer layer 12 made of single crystal AlN with a thickness of 50 nm was formed on the substrate 11.

[Formation of Ground Layer]

Subsequently, the substrate 11 formed with the buffer layer 12 was transported into the chamber 41 of the sputtering apparatus 40 as represented by FIG. 5, so as to grow the ground layer made of GaN by the reactive sputtering method. Here, as the sputtering apparatus 40 for use in the GaN layer formation, there was employed a sputtering apparatus having a high frequency-type power supply, and a mechanism capable of moving a position influenced by the magnetic field using a magnet which sweeps across within the square Ga target. At this time, piping for circulating a refrigerant was equipped in the target 47 made of Ga, and a refrigerant cooled to 20° C. was circulated in the piping to prevent the fusion of Ga due to heat. Then, the GaN layer was formed by the reactive sputtering method on the buffer layer 12 which was formed on the substrate 11 by the above method. At this time, the film formation was performed while rotating the magnet 42 underneath the target 47.

Firstly, the vacuum state was prepared in the chamber 41, and the substrate 11 was heated by the temperature increase due to the heater 44 to the temperature T1=950° C. This process was performed for 5 minutes without generating plasma in the chamber 41.

Subsequently, the argon (Ar) gas and the nitrogen ($N_2$) gas were introduced into the chamber 41 while keeping the above temperature T1=950° C. Also, the high frequency wave power of 1 kW was applied to the side of the target 47 made of a metal Ga, and the bias of 100 W was applied to the substrate 11 side. Then, while keeping the pressure in the reactor within a range of 0.5 to 1 Pa, the film formation was performed for 5 minutes under the conditions where the distance between the substrate 41 and the target 47 was 110 mm and the Ar gas and the nitrogen gas were respectively circulated at the flow rates of 15 sccm and 5 sccm (nitrogen ratio in the total gas was 25%), to form the GaN layer with a thickness of about 50 nm on the buffer layer 12. Thereafter, the temperature of the substrate 11 was adjusted by the temperature decrease due to the heater 44 to the temperature T2=800° C. In addition, the film formation was continued for 25 minutes, to form the GaN layer with a thickness of about 1,000 nm.

In this manner, the film formation of the GaN layer was performed for total 30 minutes, to form the ground layer 14a made of GaN with the total thickness of about 1 μm (1,000 nm), and then, the plasma operation was stopped. The substrate taken out from the chamber 41 after the film formation was colorless and transparent, and the surface of the GaN layer (ground layer) was a mirror plane.

[Measurement of X-Ray Rocking Curve of Ground Layer]

The X-ray rocking curve (XRC) for the undoped GaN layer (ground layer 14a) formed according to the above procedure was measured using an X-ray measurement apparatus (manufactured by PANalytical; four crystal X-ray measurement apparatus, model: X' pert). The measurement was performed for the symmetric (0002) plane and the asymmetric (10-10) plane using a Cuβ-ray X-ray beam generation source as the light source. In general, in the case of a Group III nitride compound semiconductor, a full width at half maximum in the XRC spectra of the (0002) plane acts as an indicator of the crystal smoothness (mosaicity), whereas a full width at half maximum in the XRC spectra of the (10-10) plane acts as an indicator of the dislocation density (twist).

The formed ground layer 14a had the full width at half maximum in the X-ray rocking curve of the (0002) plane being about 40 seconds and the full width at half maximum in the X-ray rocking curve of the (0100) plane being about 400 seconds, and it could be confirmed that the ground layer 14a was excellent in crystallinity.

Comparative Example 1

In Comparative example 1, according to the same procedure as in above Example 1 except that the temperature decrease was not performed at the overall steps for the formation of the ground layer made of GaN so as to constantly adjust the temperature of the substrate to 950° C., the buffer layer was formed on the substrate, and the ground layer made of GaN was formed thereon.

In Comparative example 1, the substrate taken out from the chamber after the film formation was colorless and transparent, and the surface of the GaN layer (ground layer) was a mirror plane. In addition, the ground layer made of GaN had the full width at half maximum in the X-ray rocking curve of the (0002) plane being about 40 seconds and the full width at half maximum in the X-ray rocking curve of the (0100) plane being about 400 seconds, and the crystallinity thereof was almost as excellent as in Example 1. However, in Comparative example 1, the film formation time was about 2 hours until the thickness of the ground layer made of GaN became 1 μm, which was about 4 times as long as in Example 1.

Comparative Example 2

In Comparative example 2, according to the same procedure as in above Example 1 except that the temperature decrease was not performed at the overall steps for the formation of the ground layer made of GaN so as to constantly adjust the temperature of the substrate to 800° C., the buffer layer was formed on the substrate, and the ground layer made of GaN was formed thereon.

In Comparative example 2, the film formation time was about 30 minutes until the thickness of the ground layer made of GaN became 1 μm, and the film formation rate was almost the same as in Example 1. However, in Comparative example 2, the ground layer made of GaN had the full width at half maximum in the X-ray rocking curve of the (0002) plane being about 200 seconds and the full width at half maximum in the X-ray rocking curve of the (0100) plane being about 1500 seconds, and thus, the crystallinity thereof was much poorer than in Example 1.

Example 2

In Example 2, according to the following procedure, the buffer layer 12 was formed on the substrate 11 using the sputtering apparatus 40 shown in FIG. 5, and then the ground layer 14a made of GaN was formed thereon.

In present Example, firstly, the buffer layer 12 made of AlN having a single-crystalline structure was formed on the c plane of the substrate 11 made of sapphire using the sputtering apparatus 40 according to the same procedure as in Example 1. The ground layer 14a of the n-type semiconductor layer 14 made of the undoped GaN layer was formed thereon.

<Formation of Ground Layer>

Firstly, the substrate 11 formed with the buffer layer 12 was removed from the chamber of the sputtering apparatus and transported into the chamber 41 of the sputtering apparatus 40 as represented by FIG. 5. As the sputtering apparatus 40 for use in the formation of the ground layer 14a of the n-type semiconductor layer 14, there was employed a sputtering apparatus in which the target 47 was made of a metal Ga and piping for circulating a refrigerant was equipped in the target 47. During the formation of the ground layer 14a, a refrigerant cooled to 20° C. was circulated in the piping to prevent the fusion of Ga due to heat.

[Pretreatment Step]

Before performing the formation of the ground layer 14a, the substrate 11 was heated to 500° C. in the chamber 41 of the sputtering apparatus 40, into which a nitrogen gas was introduced at a flow rate of 15 sccm. Then, while keeping the pressure in the chamber at 1.0 Pa and applying a high frequency bias of 50 W to the substrate 11, the substrate 11 was exposed to a nitrogen plasma, to thereby effect washing of the surface of the substrate 11 formed with the buffer layer 12.

After performing the above pretreatment, the vacuum state was prepared in the chamber 41, the temperature of the substrate 11 was increased to the temperature T1=950° C., and the argon gas atmosphere was prepared in the chamber 41.

(1) First Plasma Generation Step

Subsequently, while keeping the temperature of the substrate 11 to T1=950° C., an argon gas was introduced into the chamber 41 at a flow rate of 5 sccm. While keeping the argon atmosphere at a pressure of 0.5 Pa in the chamber 41, the RF power of 0.5 W/cm$^2$ was applied to the target 47 made of Ga, to thereby generate the first plasma containing Ga particles. Under these conditions, the thin film made of Ga was formed on the substrate 11 for the process time of about 5 minutes. The obtained Ga thin film had a thickness of 3.4 nm.

(2) First-Second Gas Exchanging Step

Following the above first plasma generation step, the RF power for the target 47 was turned off. At the same time that the feeding of the argon gas into the chamber 41 was stopped, the RF power of 100 W was applied to the substrate 11 side, and the feeding the nitrogen gas was started. Herein, this step was performed for 1 second while controlling the pressure in the chamber 41 to more than 0.05 Pa to prevent the plasma from disappearing.

(3) Second Plasma Generation Step

Following the first-second gas exchanging step, the pressure in the chamber 41 was set to 1.0 Pa. The second plasma containing a nitrogen element was provided onto the substrate 11 for 5 seconds under the conditions where the nitrogen flow rate was 15 sccm, the RF power applied to the substrate 11 side was 100 W, and the temperature of the substrate 11 was T1=950° C.

(4) Second-First Gas Exchanging Step

Subsequently, the feeding of the argon gas was started at the same time that the feeding of the nitrogen gas into the chamber 41 was stopped. Herein, this step was performed for 1 second under the conditions where the temperature of the substrate 11 was T1=950° C. and the pressure in the chamber 41 was 0.2 Pa while applying the RF power of 20 W to the substrate 11 side to prevent the plasma from disappearing.

(Repetition of Respective Steps)

The series of the above steps (1) to (4) were repeated for 999 times, and then, the steps (1) to (3) were respectively performed for the last time, to thereby form the ground layer 14a made of GaN with a thickness of 6 μm on the buffer layer 12 that was formed on the substrate 11. During this process, the film formation was temporarily stopped on the completion of repeating the series of the above steps (1) to (4) for 6 times (when the thickness became 20 nm), and the temperature of the substrate 11 was lowered from T1=950° C. to T2=850° C. Then, the plasma operation in the chamber 41 was stopped on the completion of the formation of the ground layer 14a, and the temperature of the substrate 11 was lowered to room temperature. In this manner, the ground layer 14a was formed by repeating the first plasma step and the second plasma step, and the film formation rate thereof was 30 nm/min.

The results of the measurement of the X-ray rocking curve (XRC) revealed that the ground layer 14a produced in the manufacturing method of Example 2 showed the full width at half maximum of 30 arcsec in the measurement of the (0002) plane and the full width at half maximum of 350 arcsec in the measurement of the (10-10) plane.

Example 3

In Example 3, according to the same procedure as in Example 2, the buffer layer 12 was formed on the substrate 11, and then the ground layer 14a made of GaN was formed thereon. In addition, the respective layers were formed thereon according to the following procedure, to thereby produce the laminated semiconductor 10 represented by FIG. 1. Moreover, the transparent electrode 17, the positive electrode bonding pad 18, and the negative electrode 19 were formed for the laminated semiconductor 10, to thereby produce the light-emitting device 1 represented by FIGS. 2 and 3.

[Formation of N-Type Contact Layer]

According to the same procedure as in Example 2, the substrate 11 formed with the buffer layer 12 and the ground layer 14a was transported from the sputtering apparatus 40 into the chamber 41 of the other sputtering apparatus 40 having the same structure. As the sputtering apparatus 40 for use in the formation of the n-type contact layer 14b, there was employed the sputtering apparatus 40 which was the same as employed in the formation of the ground layer 14a except that the Si piece was disposed on the Ga target as the target 47.

Also, under the same conditions as in the formation of the ground layer 14a, the series of the steps, which were similar to the above steps (1) to (4), were repeated for 333 times, and then, the steps, which were similar to the steps (1) to (3), were respectively performed for the last time. Thus, the n-type contact layer 14b, which had a dopant concentration of $1 \times 10^{19}$ cm$^{-3}$ and a thickness of 2 μm, was formed on the ground layer 14a that was formed on the substrate 11. The plasma operation in the chamber 41 was stopped on the completion of the formation of the n-type contact layer 14b, and the temperature of the substrate 11 was lowered to room temperature. In this manner, the n-type contact layer 14b was formed by repeating the first plasma step and the second plasma step, and the film formation rate thereof was 30 nm/min.

The substrate 11, on which the n-type contact layer 14b was formed as described above, was colorless and mirror-like.

[Formation of N-Type Clad Layer]

Subsequently, the substrate 11, on which the n-type contact layer 14b was formed according to the above procedure, was transported into the reactor of the MOCVD apparatus, and the n-type clad layer 14c, which was made of In$_{0.1}$Ga$_{0.9}$N and had a dopant concentration of $1 \times 10^{18}$ cm$^{-3}$ and a thickness of 20 nm, was formed by the MOCVD method on the n-type contact layer 14b of the sample produced according to the above procedure.

[Formation of Light-Emitting Layer]

Next, the light-emitting layer 15 having a multiquantum well structure comprised of barrier layers 15a made of GaN and well layers 15b made of In$_{0.2}$Ga$_{0.8}$N was formed by the MOCVD method on the n-type clad layer 14c of the sample produced according to the above procedure. Upon formation of this light-emitting layer 15, firstly a barrier layer 15a was formed on the n-type clad layer 14c made of Si-doped GaN, followed by formation of a well layer 15b made of In$_{0.2}$Ga$_{0.8}$N on this barrier layers 15a. After five times repetition of such a lamination procedure, a sixth barrier layer 15a was formed on a well layer 15b that had been laminated at the fifth time, to make a structure in which barrier layers 15a were disposed on both sides of the light-emitting layer 15 of a multiquantum well structure.

In other words, the barrier layer 15a that was made of GaN and had a thickness of 16 nm was formed by setting the temperature of the substrate 11 to 750° C. and feeding ammonia, TEG, and monosilane into the reactor while circulating a nitrogen carrier gas Next, on completion of growth of the barrier layer 15a, while the temperature of the substrate 11, the pressure in the reactor, and the flow rate and type of the carrier gas were kept as they were, the valves for TEG and TMI were switched to supply TEG and TMI into the reactor to thereby grow a well layer 15b made of In$_{0.2}$Ga$_{0.8}$N. By so doing, the well layer 15b having a thickness of 3 nm was formed.

On completion of growth of the well layer 15b, another barrier layer 15a was grown. Then, such a procedure was repeated five times to thereby form five barrier layers 15a and five well layers 15b. Furthermore, another barrier layer 15a was formed on the top of the finally-laminated well layer 15b, to make the light-emitting layer 15.

[Formation of P-Type Clad Layer and P-Type Contact Layer]

The p-type semiconductor layer 16 comprised of the p-type clad layer 16a and p-type contact layer 16b was formed using the MOCVD apparatus on the wafer that had been obtained by the respective treatments described above.

Herein, a conventionally known apparatus was used as the MOCVD apparatus used for the formation of the p-type semiconductor layer 16. At this time, the p-type semiconductor layer 16 was doped with Mg.

Consequently, the p-type semiconductor layer 16, which was comprised of the p-type clad layer 16a that was made of Mg-doped $Al_{0.1}Ga_{0.9}N$ and had a thickness of 10 nm and p-type contact layer 16b that was made of Mg-doped $Al_{0.02}Ga_{0.98}N$ and had a thickness of 200 nm, was formed.

The p-type contact layer 16b that was made of Mg-doped $Al_{0.02}Ga_{0.98}N$ and constituted the p-type semiconductor layer 16 exerted the p-type characteristics without an annealing treatment for activating the p-type carrier.

As with the laminated semiconductor 10 as shown in FIG. 1, the epitaxial wafer for an LED, which was produced by the above manner, has the laminated structure including: the substrate 11 made of sapphire having a c plane; the AlN layer (intermediate layer 12) having a single-crystalline structure; the undoped GaN layer (ground layer 14a) with a thickness of 6 nm; the Si-doped GaN layer (n-type contact layer 14b) having an electron concentration of $5\times10^{18}$ cm$^{-3}$ and a thickness of 2 μm; the InGaN clad layer (n-type clad layer 14c) having a dopant concentration of $1\times10^{18}$ cm$^{-3}$ and a thickness of 20 nm; the multiquantum well structure (light-emitting layer 15), which was comprised of six GaN barrier layers (barrier layers 15a) with a thickness of 16 nm and five undoped $In_{0.2}Ga_{0.8}N$ well layers (well layers 15b) with a thickness of 3 nm, being sandwiched by the GaN barrier layers on both sides; and the Mg-doped AlGaN layer (p-type semiconductor layer 16) comprised of a p-type clad layer 16a made of Mg-doped $Al_{0.1}Ga_{0.9}N$ with a thickness of 10 nm and a p-type contact layer 16b made of Mg-doped $Al_{0.02}Ga_{0.98}N$ with a thickness of 200 nm.

[Production of LED]

Subsequently, an LED was produced using the above epitaxial wafer (laminated semiconductor 10).

That is, on the surface of the Mg-doped AlGaN layer (p-type semiconductor layer 16b) of the abovementioned epitaxial wafer was formed a transparent electrode 17 made of ITO by a well known photolithographic method. A positive electrode bonding pad 18 (p electrode bonding pad) having a laminated structure of titanium, aluminum, and gold in this order, was formed thereon for use as a p-side electrode. Furthermore, the wafer was subjected to dry etching to expose an area to be formed with an n-side electrode (negative electrode) of the n-type contact layer 14b. Then, on this exposed area 14d was formed a negative electrode 19 (n-side electrode) composed of a lamination of four layers of Ni, Al, Ti, and Au in this order. By such a procedure, on the wafer (refer to the laminated semiconductor 10 of FIG. 1) were formed the respective electrodes in the shapes as shown in FIG. 2.

Then, the wafer formed with the respective p-side and n-side electrodes by the abovementioned procedure was subjected to grinding and polishing on the backside of the substrate 11 made of sapphire to make a mirror-like plane. Then, the wafer was cut into a 350-μm-square chip, which was disposed on a lead frame so that the respective electrodes faced upward, and was connected to the lead frame by gold wires to produce a light-emitting device (refer to the lamp 3 of FIG. 4).

A forward current was applied to between the p-side and n-side electrodes of the light emitting diode produced by the above manner. As a result, the forward voltage at a current of 20 mA was 3.1 V. In addition, the emitting state was observed through the p-side transparent electrode 17, which showed that the emission wavelength was 450 nm and the emission output was 18 mW. Such characteristics of the light emitting diode were uniformly obtained in the light emitting diode produced from almost the entire surface of the thus produced wafer.

From the above results, it is apparent that the Group III nitride semiconductor according to the present invention has excellent device characteristics, and the Group III nitride semiconductor light-emitting device according to the present invention has excellent light emission characteristics.

INDUSTRIAL APPLICABILITY

The method for manufacturing a Group III nitride semiconductor of the present invention is capable of efficiently producing a Group III nitride semiconductor having excellent crystallinity by using a reactive sputtering method, and thus can be preferably employed for the production of a ground layer included in an n-type semiconductor layer of a light emitting diode (LED) and a laser diode (LD), and various semiconductor devices including electronic devices such as FETs.

The invention claimed is:

1. A method for manufacturing a Group III nitride semiconductor, comprising:
a sputtering step of forming a single-crystalline Group III nitride semiconductor on a substrate by a reactive sputtering method in a chamber in which a substrate and a Ga element-containing target are disposed, wherein
said sputtering step includes respective substeps of: a first sputtering step of performing a film formation of the Group III nitride semiconductor while setting the temperature of the substrate to a temperature T1; and a second sputtering step of continuing the film formation of the Group III nitride semiconductor while lowering the temperature of the substrate to a temperature T2 which is lower than the temperature T1,
further comprising: a vacuum step of removing an oxygen layer attached to the surface of the substrate, by preparing a vacuum state in the chamber and heating the substrate to the temperature T1,
wherein said first sputtering step and second sputtering step are performed in this order following said vacuum step.

2. The method for manufacturing a Group III nitride semiconductor according to claim 1, wherein the temperature T1 of the substrate is within a range of 800° C. to 1,100° C. in said first sputtering step, and the temperature T2 of the substrate is within a range of 700° C. to 1,000° C. in said second sputtering step.

3. The method for manufacturing a Group III nitride semiconductor according to claim 1, wherein the temperatures T1 and T2 of the substrate satisfy a relationship represented by a following formula: {20° C.≤(T1−T2)≤300° C.}.

4. The method for manufacturing a Group III nitride semiconductor according to claim 1, wherein the temperatures T1 and T2 of the substrate satisfy a relationship represented by a following formula: {50° C.≤(T1−T2)≤200° C.}.

5. The method for manufacturing a Group III nitride semiconductor according to claim 1, wherein a film of the Group III nitride semiconductor with a thickness t1 within a range of 5 to 100 nm is formed in said first sputtering step, and then a film of the Group III nitride semiconductor with a thickness t2 of 10 nm or more is formed in said second sputtering step.

6. The method for manufacturing a Group III nitride semiconductor according to claim 1, wherein the Group III nitride semiconductor is subjected to the film formation in a gas atmosphere having a nitrogen atom-containing gas and an inert gas in said first sputtering step and second sputtering step.

7. The method for manufacturing a Group III nitride semiconductor according to claim 6, wherein the nitrogen atom-containing gas is a nitrogen gas ($N_2$), and the inert gas is an argon gas (Ar).

8. The method for manufacturing a Group III nitride semiconductor according to claim 1, further comprising:
a buffer layer formation step of forming a buffer layer on the substrate by the reactive sputtering method, wherein said vacuum step, first sputtering step, and second sputtering step are performed in this order following said buffer layer formation step.

9. The method for manufacturing a Group III nitride semiconductor according to claim 8, further comprising:
a pretreatment step of subjecting a surface of the substrate to a pretreatment by a plasma treatment, wherein said buffer layer formation step, vacuum step, first sputtering step, and second sputtering step are performed in this order following said pretreatment step.

10. A method for manufacturing a Group III nitride semiconductor light-emitting device, comprising laminating an n-type semiconductor layer, a light-emitting layer, and a p-type semiconductor layer in this order, each layer being comprised of a Group III nitride semiconductor, wherein
at least a part of the n-type semiconductor layer is formed by the method for manufacturing a Group III nitride semiconductor according to claim 1.

11. A method for manufacturing a Group III nitride semiconductor light-emitting device, comprising laminating an n-type semiconductor layer, a light-emitting layer, and a p-type semiconductor layer in this order, each layer being comprised of a Group III nitride semiconductor, wherein
the n-type semiconductor layer comprises a ground layer, and the ground layer is formed by the method for manufacturing a Group III nitride semiconductor according to claim 1.

12. A Group III nitride semiconductor light-emitting device which is obtained by the method for manufacturing a Group III nitride semiconductor light-emitting device according to claim 10.

13. A lamp comprising the Group III nitride semiconductor light-emitting device according to claim 12.

* * * * *